(12) United States Patent
Jin et al.

(10) Patent No.: US 12,354,512 B2
(45) Date of Patent: Jul. 8, 2025

(54) DRIVING CIRCUIT, DRIVING METHOD AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Honggui Jin, Beijing (CN); Hongjun Yu, Beijing (CN); Hanqing Liu, Beijing (CN); Jian Wang, Beijing (CN); Yong Zhang, Beijing (CN); Ruomei Bian, Beijing (CN); Peipei Wang, Beijing (CN); Zhilong Duan, Beijing (CN); Yue Yang, Beijing (CN); Xin Li, Beijing (CN); Yong Song, Beijing (CN); Qiang Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/044,368

(22) PCT Filed: Apr. 28, 2022

(86) PCT No.: PCT/CN2022/089825
§ 371 (c)(1),
(2) Date: Mar. 7, 2023

(87) PCT Pub. No.: WO2023/206219
PCT Pub. Date: Nov. 2, 2023

(65) Prior Publication Data
US 2024/0296768 A1    Sep. 5, 2024

(51) Int. Cl.
*G09G 3/20*      (2006.01)

(52) U.S. Cl.
CPC ....... *G09G 3/20* (2013.01); *G09G 2300/0413* (2013.01); *G09G 2330/02* (2013.01)

(58) Field of Classification Search
CPC ............. G09G 3/20; G09G 2300/0413; G09G 2330/02
See application file for complete search history.

(56) References Cited

U.S. PATENT DOCUMENTS

| | | |
|---|---|---|
| 2018/0082652 A1 | 3/2018 | Lv et al. |
| 2018/0096645 A1 | 4/2018 | Lee et al. |
| | (Continued) | |

FOREIGN PATENT DOCUMENTS

| | | |
|---|---|---|
| CN | 204966019 U | 1/2016 |
| CN | 105529009 A | 4/2016 |
| | (Continued) | |

*Primary Examiner* — Krishna P Neupane
(74) *Attorney, Agent, or Firm* — McCoy Russell LLP

(57) ABSTRACT

The present disclosure provides a driving circuit, a driving method and a display device. The driving circuit includes a first pull-down node, a first control circuit and a pull-up node reset circuit; the first control circuit is configured to control to connect the first pull-down node and the first voltage terminal under the control of the first control signal provided by the first control terminal, so that a potential of the first pull-down node is a valid voltage; the pull-up node reset circuit is configured to control to connect the pull-up node and the second voltage terminal when the potential of the first pull-down node is a valid voltage, so as to reset the potential of the pull-up node.

16 Claims, 20 Drawing Sheets

(56) References Cited

U.S. PATENT DOCUMENTS

| | | | |
|---|---|---|---|
| 2018/0174548 A1* | 6/2018 | Hao | ............... G11C 19/184 |
| 2018/0268755 A1 | 9/2018 | Chen | |
| 2019/0244577 A1 | 8/2019 | Kusumi et al. | |
| 2021/0225251 A1 | 7/2021 | Xu et al. | |
| 2021/0335175 A1* | 10/2021 | Mi | ................... G11C 19/28 |

FOREIGN PATENT DOCUMENTS

| | | | |
|---|---|---|---|
| CN | 205282053 U | 6/2016 | |
| CN | 106601168 A | 4/2017 | |
| CN | 109064964 A | 12/2018 | |
| CN | 109427310 A | 3/2019 | |
| CN | 109903718 A | 6/2019 | |
| CN | 111312322 A | 6/2020 | |
| CN | 113140176 A | 7/2021 | |
| CN | 113823348 A | 12/2021 | |
| CN | 114267307 A | 4/2022 | |
| JP | 2010238323 A | 10/2010 | |
| JP | 2018078573 A | 5/2018 | |
| JP | 2022000833 A | 1/2022 | |
| KR | 101941451 B1 | 1/2019 | |
| WO | WO 2020/034856 A1 * | 2/2020 | ............. G11C 19/28 |

\* cited by examiner

DRIVING CIRCUIT, DRIVING METHOD AND DISPLAY DEVICE

CROSS REFERENCE TO RELATED APPLICATION

The present disclosure is the U.S. national phase of PCT Application No. PCT/CN2022/089825 filed on Apr. 28, 2022, which is incorporated herein by reference in its entireties.

TECHNICAL FIELD

The present disclosure relates to the field of display technology, in particular to a driving circuit, a driving method and a display device.

BACKGROUND

In the related art, the driving circuit may only include one pull-down node and one pull-down node control circuit to achieve a narrow frame, but since there is only one pull-down node to control the potential, the transistor characteristics will have a certain degree of drift during the high-temperature and high-humidity reliability process, the threshold voltage of the transistor included in the input circuit drifts negatively under the action of negative bias, the leakage current increases, and the second input voltage terminal leaks current to the pull-up node to generate noise, and the characteristics of the transistor included in the pull-up node reset circuit and the characteristics of the transistor whose gate electrode is electrically connected to the first pull-down control node in the first pull-down node control circuit drift positively, which causes the potential of the first pull-down node to decrease, and the noise reduction capability of the transistor included in the pull-up node reset circuit is decreased, and the potential of the pull-up node cannot be pulled down to a low voltage, so that the driving circuit outputs by mistake and generates multiple driving signals.

SUMMARY

In one aspect, the present disclosure provides in some embodiments a driving circuit, including a first pull-down node, a first control circuit and a pull-up node reset circuit; the first control circuit is electrically connected to the first pull-down node, a first control terminal, and a first voltage terminal, respectively, is configured to control to connect the first pull-down node and the first voltage terminal under the control of a first control signal provided by the first control terminal, so that a potential of the first pull-down node is a valid voltage; the pull-up node reset circuit is electrically connected to the first pull-down node, a pull-up node, and a second voltage terminal, and is configured to control to connect the pull-up node and the second voltage terminal when the potential of the first pull-down node is the valid voltage, so as to reset a potential of the pull-up node.

Optionally, the first control terminal is a reset terminal, the first pull-down node or a first pull-down control node.

Optionally, the first control circuit comprises a first transistor; a gate electrode of the first transistor is electrically connected to the first control terminal, a first electrode of the first transistor is electrically connected to the first pull-down node, and a second electrode of the first transistor is electrically connected to the first voltage terminal; the pull-up node reset circuit includes a second transistor; a gate electrode of the second transistor is electrically connected to the first pull-down node, a first electrode of the second transistor is electrically connected to the pull-up node, and a second electrode of the second transistor is electrically connected to the second voltage terminal.

Optionally, the driving circuit further includes a reset circuit; the reset circuit is respectively electrically connected to the reset terminal, the pull-up node and the first input voltage terminal, and is configured to control to write a first input voltage provided by the first input voltage terminal into the pull-up node under the control of a reset signal provided by the reset terminal.

Optionally, the driving circuit further includes a first pull-down node control circuit; the first pull-down node control circuit is electrically connected to the first pull-down node, the first pull-down control node, the pull-up node, a first control voltage terminal and a third voltage terminal, is configured to control to connect the first control voltage terminal and the first pull-down control node under the control of the first control voltage provided by the first control voltage terminal, and control to connect the first pull-down control node and the third voltage terminal under the control of the potential of the pull-up node, and control to connect the first pull-down control node and the first control voltage terminal under the control of the potential of the first pull-down control node, and control to connect the first pull-down node and the third voltage terminal under the control of the potential of the pull-up node; the first voltage terminal is the first control voltage terminal.

Optionally, the driving circuit further includes an output circuit; the output circuit is electrically connected to the pull-up node, the first pull-down node, an output clock signal terminal, a fourth voltage terminal and a driving signal output terminal, and is configured to control to write an output clock signal provided by the output clock signal terminal into the driving signal output terminal under the control of the potential of the pull-up node, and control to connect the driving signal output terminal and the fourth voltage terminal under the control of the potential of the first pull-down node.

Optionally, the driving circuit further includes a second pull-down node and a second control circuit; the second control circuit is electrically connected to the second pull-down node, the second control terminal and a fifth voltage terminal, and is configured to control to connect the second pull-down node and the fifth voltage terminal under the control of a second control signal provided by the second control terminal, so that a potential of the second pull-down node is a valid voltage; the pull-up node reset circuit is also electrically connected to the second pull-down node, and is configured to control to connect the pull-up node and the second voltage terminal when the potential of the second pull-down node is the valid voltage, to reset the potential of the pull-up node.

Optionally, the second control terminal is a reset terminal, a second pull-down node or a second pull-down control node.

Optionally, the second control circuit comprises a third transistor; the pull-up node reset circuit further comprises a fourth transistor; a gate electrode of the third transistor is electrically connected to the second control terminal, a first electrode of the third transistor is electrically connected to the second pull-down node, and a second electrode of the third transistor is electrically connected to the fifth voltage terminal; a gate electrode of the fourth transistor is electrically connected to the second pull-down node, a first electrode of the fourth transistor is electrically connected to the pull-up node, and a second electrode of the fourth transistor is electrically connected to the second voltage terminal.

Optionally, the driving circuit further includes a second pull-down node control circuit; the second pull-down node control circuit is electrically connected to the second pull-down node, the second pull-down control node, the pull-up node, the second control voltage terminal, and the third voltage terminal, respectively, is configured to control to connect the second control voltage terminal and the second pull-down control node under the control of the second control voltage provided by the second control voltage terminal, control to connect the second pull-down control node and the third voltage terminal under the control of the potential of the pull-up node, control to connect the second pull-down node and the second control voltage terminal under the control of the potential of the second pull-down control node, and control to connect the second pull-down node and the third voltage terminal under the control of the potential of the pull-up node; the fifth voltage terminal is the second control voltage terminal.

Optionally, the driving circuit further includes an input circuit, an output reset circuit, an initial reset circuit and an energy storage circuit; the input circuit is respectively electrically connected to the input terminal, the second input voltage terminal and the pull-up node, and is configured to control to write the second input voltage provided by the second input voltage terminal into the pull-up node under the control of the input signal provided by the input terminal; the output reset circuit is electrically connected to a frame reset terminal, the driving signal output terminal and a fourth voltage terminal respectively, and is configured to control to connect the driving signal output terminal and the fourth voltage terminal under the control of a frame reset signal provided by the frame reset terminal; the initial reset circuit is electrically connected to the initial reset terminal, the pull-up node and the fourth voltage terminal, and is configured to control to connect the pull-up node and the fourth voltage terminal under the control of the initial reset signal provided by the initial reset terminal; a first end of the energy storage circuit is electrically connected to the pull-up node, a second end of the energy storage circuit is electrically connected to the driving signal output terminal, and the energy storage circuit is used for storing electric energy.

Optionally, the reset circuit comprises a fifth transistor; a gate electrode of the fifth transistor is electrically connected to the reset terminal, a first electrode of the fifth transistor is electrically connected to the pull-up node, and a second electrode of the fifth transistor is electrically connected to the first input voltage terminal.

Optionally, the first pull-down node control circuit comprises a sixth transistor, a seventh transistor, an eighth transistor and a ninth transistor; both a gate electrode of the sixth transistor and a first electrode of the sixth transistor are electrically connected to the first control voltage terminal, and a second electrode of the sixth transistor is electrically connected to the first pull-down control node; a gate electrode of the seventh transistor is electrically connected to the pull-up node, a first electrode of the seventh transistor is electrically connected to the first pull-down control node, and a second electrode of the seventh transistor is electrically connected to the third voltage terminal; a gate electrode of the eighth transistor is electrically connected to the first pull-down control node, a first electrode of the eighth transistor is electrically connected to the first control voltage terminal, and a second electrode of the eighth transistor is electrically connected to the first pull-down node; a gate electrode of the ninth transistor is electrically connected to the pull-up node, a first electrode of the ninth transistor is electrically connected to the first pull-down node, and a second electrode of the ninth transistor is electrically connected to the third voltage terminal.

Optionally, the second pull-down node control circuit comprises a tenth transistor, an eleventh transistor, a twelfth transistor, and a thirteenth transistor; both a gate electrode of the tenth transistor and a first electrode of the tenth transistor are electrically connected to the second control voltage terminal, and a second electrode of the tenth transistor is electrically connected to the second pull-down control node; a gate electrode of the eleventh transistor is electrically connected to the pull-up node, a first electrode of the eleventh transistor is electrically connected to the second pull-down control node, and a second electrode of the eleventh transistor is electrically connected to the third voltage terminal; a gate electrode of the twelfth transistor is electrically connected to the second pull-down control node, a first electrode of the twelfth transistor is electrically connected to the second control voltage terminal, and a second electrode of the twelfth transistor is electrically connected to the second pull-down node; a gate electrode of the thirteenth transistor is electrically connected to the pull-up node, a first electrode of the thirteenth transistor is electrically connected to the second pull-down node, and a second electrode of the tenth transistor is electrically connected to the third voltage terminal.

Optionally, the input circuit comprises a fourteenth transistor; a gate electrode of the fourteenth transistor is electrically connected to the input terminal, a first electrode of the fourteenth transistor is electrically connected to the second input voltage terminal, and a second electrode of the fourteenth transistor is electrically connected to the pull-up node; the output circuit includes a fifteenth transistor and a sixteenth transistor; a gate electrode of the fifteenth transistor is electrically connected to the pull-up node, a first electrode of the fifteenth transistor is electrically connected to the output clock signal terminal, and a second electrode of the fifteenth transistor is electrically connected to the driving signal output terminal; a gate electrode of the sixteenth transistor is electrically connected to the first pull-down node, a first electrode of the sixteenth transistor is electrically connected to the driving signal output terminal, and a second electrode of the sixteenth transistor electrically connected to the fourth voltage terminal; the output reset circuit includes a seventeenth transistor; a gate electrode of the seventeenth transistor is electrically connected to the frame reset terminal, a first electrode of the seventeenth transistor is electrically connected to the driving signal output terminal, and a second electrode of the seventeenth transistor is electrically connected to the fourth voltage terminal; the initial reset circuit includes an eighteenth transistor; a gate electrode of the eighteenth transistor is electrically connected to the initial reset terminal, a first electrode of the eighteenth transistor is electrically connected to the pull-up node, and a second electrode of the eighteenth transistor is electrically connected to the fourth voltage terminal; the energy storage circuit includes a storage capacitor; a first end of the storage capacitor is electrically connected to the pull-up node, and a second end of the storage capacitor is electrically connected to the driving signal output terminal.

Optionally, the driving circuit further includes a second pull-down node; the output circuit is also electrically connected to the second pull-down node, and is configured to control to connect the driving signal output terminal and the fourth voltage terminal under the control of the potential of the second pull-down node.

Optionally, the output circuit further comprises a nineteenth transistor; a gate electrode of the nineteenth transistor is electrically connected to the second pull-down node, a first electrode of the nineteenth transistor is electrically connected to the driving signal output terminal, and a second electrode of the nineteenth transistor is electrically connected to the fourth voltage terminal.

In a second aspect, a driving method is applied to the driving circuit and includes: controlling, by the first control circuit, to connect the first pull-down node and the first voltage terminal under the control of the first control signal, so that the potential of the first pull-down node is the valid voltage; when the potential of the first pull-down node is a valid voltage, controlling, by the pull-up node reset circuit, to connect the pull-up node and the second voltage terminal, so as to reset the potential of the pull-up node.

Optionally, the driving circuit further comprises a second pull-down node and a second control circuit; the driving method further includes: controlling, by the second control circuit, to connect the second pull-down node and the fifth voltage terminal under the control of the second control signal, so that the potential of the second pull-down node is a valid voltage; when the potential of the second pull-down node is the valid voltage, controlling, by the pull-up node reset circuit, to connect the pull-up node and the second voltage terminal, so as to reset the potential of the pull-up node.

In a third aspect, a display device includes the driving circuit.

Optionally, the display device includes a driving module; the driving module includes a plurality of stages of driving circuits cascaded to each other; a first input voltage terminal of a last stage of driving circuit included in the driving module is not connected to a corresponding first input voltage, and the last stage of driving circuit is a dummy driving circuit; the display device further includes a plurality of rows and a plurality of columns of pixel circuits arranged in a display area, and a last row of pixel circuits included in the display device may be a dummy pixel driving circuit; the last stage of driving circuit is used to provide a corresponding driving signal for the last row of pixel circuits, and the last row of pixel circuits do not emit light.

DETAILED DESCRIPTION

The following will clearly and completely describe the technical solutions in the embodiments of the present disclosure with reference to the accompanying drawings. Apparently, the described embodiments are only some of the embodiments of the present disclosure, not all of them. Based on the embodiments in the present disclosure, all other embodiments obtained by persons of ordinary skill in the art without making creative efforts belong to the protection scope of the present disclosure.

Figure 1:
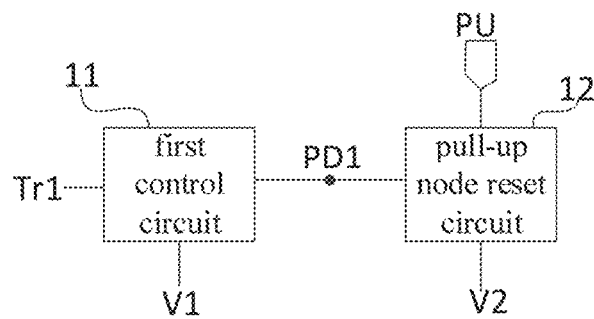
FIG. 1 is a structural diagram of a driving circuit according to an embodiment of the present disclosure.

As shown in FIG. 1, the driving circuit described in the embodiment of the present disclosure includes a first pull-down node PD1, a first control circuit 11 and a pull-up node reset circuit 12;

The first control circuit 11 is electrically connected to the first pull-down node PD1, a first control terminal Tr1, and a first voltage terminal V1, respectively, is configured to control to connect the first pull-down node PD1 and the first voltage terminal V1 under the control of the first control signal provided by the first control terminal Tr1, so that a potential of the first pull-down node PD1 is a valid voltage;

The pull-up node reset circuit 12 is electrically connected to the first pull-down node PD1, the pull-up node PU, and the second voltage terminal V2, and is configured to control to connect the pull-up node PU and the second voltage terminal V2 when the potential of the first pull-down node PD1 is a valid voltage, so as to reset the potential of the pull-up node PU.

In at least one embodiment of the present disclosure, when the transistors included in the pull-up node reset circuit 12 are n-type transistors, the valid voltage may be a high voltage; when the transistors included in the pull-up node reset circuit 12 are p-type transistor, the valid voltage may be a low voltage.

In at least one embodiment of the present disclosure, the first voltage terminal may be a first control voltage terminal GCH, or the first voltage terminal may be a high voltage terminal, but not limited thereto.

Optionally, the second voltage terminal V2 may be a low voltage terminal.

A first control circuit 11 is added to the driving circuit described in the embodiment of the present disclosure, and when the potential of the first control signal is a valid voltage, the first control circuit 11 controls to connect the first pull-down node PD1 and the first voltage terminal V1, so that the potential of the first pull-down node PD1 is a valid voltage, and the pull-up node reset circuit 12 controls to reset the potential of the pull-up node under the control of the potential of the first pull-down node PD1 to improve the noise reduction capability of the transistor included in the pull-up node reset circuit 12, and prevent the driving circuit from outputting incorrectly, so that the driving circuit can output the driving signal correctly.

In at least one embodiment of the present disclosure, the first control terminal is a reset terminal, a first pull-down node or a first pull-down control node.

Figure 2:
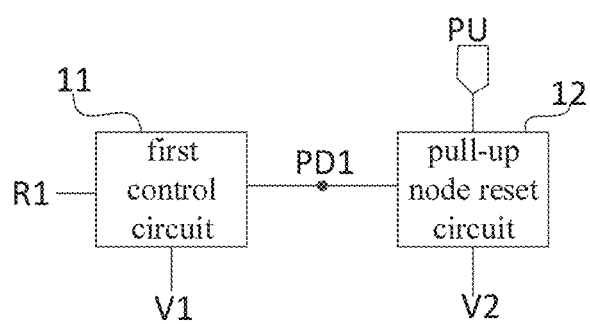
FIG. 2 is a structural diagram of a driving circuit according to at least one embodiment of the present disclosure.

As shown in FIG. 2, the driving circuit described in at least one embodiment of the present disclosure includes a first pull-down node PD1, a first control circuit 11 and a pull-up node reset circuit 12;

The first control circuit 11 is electrically connected to the first pull-down node PD1, the reset terminal R1 and the first voltage terminal V1 respectively, and is configured to control to connect the first pull-down node PD1 and the first voltage terminal V1 under the control of the reset control signal provided by the reset terminal R1, so that the potential of the first pull-down node PD1 is a valid voltage;

The pull-up node reset circuit 12 is electrically connected to the first pull-down node PD1, the pull-up node PU, and the second voltage terminal V2, and is configured to control to connect the pull-up node PU and the second voltage terminal V2 when the potential of the first pull-down node PD1 is a valid voltage, to reset the potential of the pull-up node PU.

In at least one embodiment of the driving circuit shown in FIG. 2, the first control terminal is the reset terminal R1; when the reset terminal R1 provides a high voltage signal, the potential of the first pull-down node PD1 after reliability is increased by the first voltage terminal V1, so that the current of the transistor included in the pull-up node reset circuit 12 increases, and the driving circuit does not have multi-output.

In at least one embodiment of the present disclosure, the reset terminal may be a terminal for controlling to write the first input voltage into the pull-up node, so as to reset the potential of the pull-up node.

Figure 3:
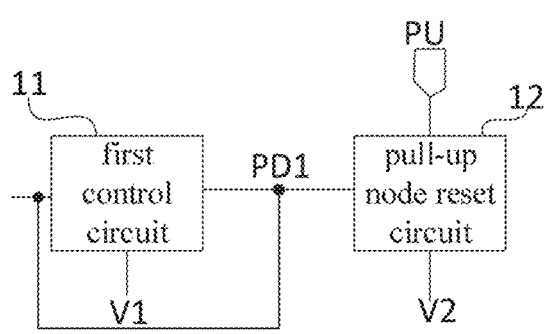
FIG. 3 is a structural diagram of a driving circuit according to at least one embodiment of the present disclosure.

As shown in FIG. 3, the driving circuit described in at least one embodiment of the present disclosure includes a first pull-down node PD1, a first control circuit 11 and a pull-up node reset circuit 12;

The first control circuit 11 is electrically connected to the first pull-down node PD1 and the first voltage terminal V1 respectively, and is configured to control to connect the first pull-down node PD1 and the first voltage terminal V1 under the control of the potential of the first pull-down node PD1, so that the potential of the first pull-down node PD1 is a valid voltage;

The pull-up node reset circuit 12 is electrically connected to the first pull-down node PD1, the pull-up node PU, and the second voltage terminal V2, and is configured to connect the pull-up node PU and the second voltage terminal V2 when the potential of the first pull-down node PD1 is a valid voltage, to reset the potential of the pull-up node PU.

In at least one embodiment of the driving circuit shown in FIG. 3, the first control terminal is the first pull-down node PD1; when the potential of the first pull-down node PD1 is a high voltage, the potential of the first pull-down node PD1 after the reliability is increased through the first voltage terminal V1, so that the current of the transistor included in the pull-up node reset circuit 12 increases, and the noise reduction ability of the transistor included in the pull-up node reset circuit 12 is enhanced, so that the driving circuit will not have multi-output.

Figure 4:
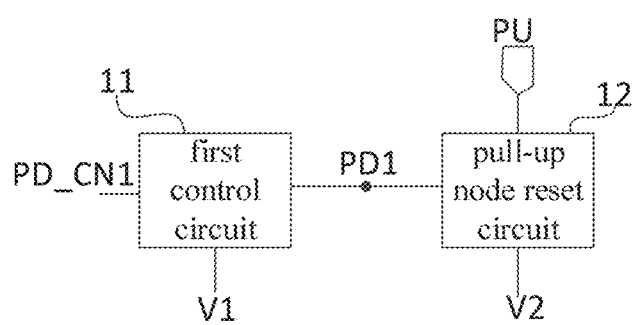
FIG. 4 is a structural diagram of a driving circuit according to at least one embodiment of the present disclosure.

As shown in FIG. 4, the driving circuit described in at least one embodiment of the present disclosure includes a first pull-down node PD1, a first control circuit 11 and a pull-up node reset circuit 12;

The first control circuit 11 is electrically connected to the first pull-down node PD1, the first pull-down control node PD_CN1, and the first voltage terminal V1, respectively, is configured to control to connect the first pull-down node PD1 and the first voltage terminal V1 under the control of the potential of the first pull-down control node PD_CN1, so that the potential of the first pull-down node PD1 is a valid voltage;

The pull-up node reset circuit 12 is electrically connected to the first pull-down node PD1, the pull-up node PU, and the second voltage terminal V2, and is configured to control to connect the pull-up node PU and the second voltage terminal V2 when the potential of the first pull-down node PD1 is a valid voltage, so as to reset the potential of the pull-up node PU.

In at least one embodiment of the driving circuit shown in FIG. 4, the first control terminal is the first pull-down control node PD_CN1; when the potential of the first pull-down control node PD_CN1 is a high voltage, the potential of the first pull-down node PD1 after the reliability is increased through the first voltage terminal V1, so that the current of the transistor included in the pull-up node reset circuit 12 increases, and the noise reduction capability of the transistor included in the pull-up node reset circuit 12 increases, so that the driving circuit will not have multi-output.

Optionally, the first control circuit includes a first transistor;

A gate electrode of the first transistor is electrically connected to the first control terminal, a first electrode of the first transistor is electrically connected to the first pull-down node, and a second electrode of the first transistor is electrically connected to the first voltage terminal;

The pull-up node reset circuit includes a second transistor;
a gate electrode of the second transistor is electrically connected to the first pull-down node, a first electrode of the second transistor is electrically connected to the pull-up node, and a second electrode of the second transistor is electrically connected to the second voltage terminal.

The driving circuit described in at least one embodiment of the present disclosure may further include a reset circuit;

The reset circuit is respectively electrically connected to a reset terminal, the pull-up node and the first input voltage terminal, and is configured to control to write the first input voltage provided by the first input voltage terminal to into the pull-up node under the control of a reset signal provided by the reset terminal.

In at least one embodiment of the present disclosure, the driving circuit may further include a reset circuit, and the reset circuit is configured to write the first input voltage into the pull-up node under the control of the reset signal.

The driving circuit described in at least one embodiment of the present disclosure may further include a first pull-down node control circuit;

The first pull-down node control circuit is electrically connected to the first pull-down node, the first pull-down control node, the pull-up node, a first control voltage terminal and a third voltage terminal, is configured to control to connect the first control voltage terminal and the first pull-down control node under the control of the first control voltage provided by the first control voltage terminal, and control to connect the first pull-down control node and the third voltage terminal under the control of the potential of the pull-up node, and control to connect the first pull-down control node and the first control voltage terminal under the control of the potential of the first pull-down control node, and control to connect the first pull-down node and the third voltage terminal under the control of the potential of the pull-up node;

The first voltage terminal is the first control voltage terminal.

In specific implementation, the driving circuit may also include a first pull-down node control circuit, and the first pull-down node control circuit controls the potential of the first pull-down node and the potential of the first pull-down control node under the control of the potential of the pull-up node and the first control voltage.

In at least one embodiment of the present disclosure, the third voltage terminal may be a low voltage terminal; the second voltage terminal and the third voltage terminal may be the same voltage terminal, but not limited thereto.

The driving circuit described in at least one embodiment of the present disclosure may further include an output circuit;

The output circuit is electrically connected to the pull-up node, the first pull-down node, an output clock signal terminal, a fourth voltage terminal and a driving signal output terminal, and is used to control to write the output clock signal provided by the output clock signal terminal into the driving signal output terminal under the control of the potential of the pull-up node, and control to connect the driving signal output terminal and the fourth voltage terminal under the control of the potential of the first pull-down node.

In at least one embodiment of the present disclosure, the driving circuit may further include an output circuit, and the output circuit writes the output clock signal into the driving signal output terminal under the control of the potential of the pull-up node, and control to connect the driving signal output terminal and the fourth voltage terminal under the control the potential of the first pull down node, so as to reduce the noise of the driving signal output terminal.

Optionally, the fourth voltage terminal is a low voltage terminal, and the second voltage terminal, the third voltage terminal and the fourth voltage terminal may be the same voltage terminal, but not limited thereto.

The driving circuit described in at least one embodiment of the present disclosure may further include a second pull-down node and a second control circuit;

The second control circuit is electrically connected to the second pull-down node, the second control terminal and a fifth voltage terminal, and is used to control to connect the second pull-down and the fifth voltage terminal under the control of the second control signal provided by the second control terminal, so that the potential of the second pull-down node is a valid voltage;

The pull-up node reset circuit is also electrically connected to the second pull-down node, and is used to control to connect the pull-up node and the second voltage terminal when the potential of the second pull-down node is a valid voltage, to reset the potential of the pull-up node.

Optionally, the fifth voltage terminal may be a second control voltage terminal or a high voltage terminal, but not limited thereto.

The driving circuit described in at least one embodiment of the present disclosure is added with a second control circuit. When the potential of the first control signal is a valid voltage, the second control circuit controls to connect the second pull-down node and the fifth voltage terminal, so that the potential of the second pull-down node is a valid voltage, the pull-up node reset circuit controls to reset the potential of the pull-up node under the control of the potential of the second pull-down node, and raises the noise reduction capability of the transistor included in the pull-up node reset circuit and prevents the driving circuit from outputting incorrectly, so that the driving circuit can correctly output the driving signal.

Optionally, the second control terminal is a reset terminal, a second pull-down node or a second pull-down control node, but not limited thereto.

Figure 5:
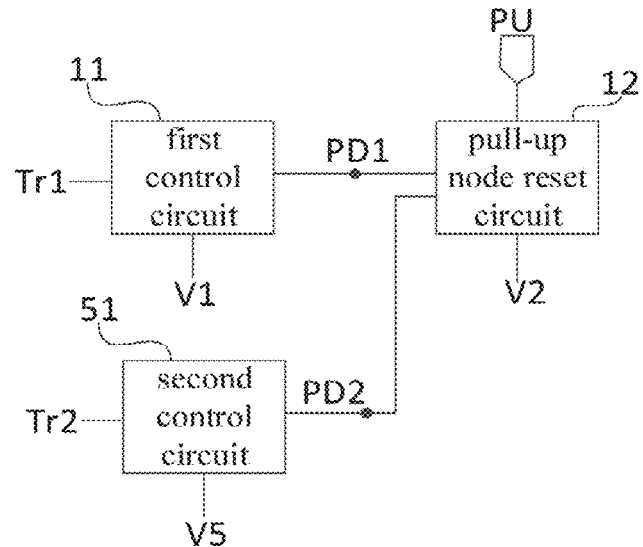
FIG. 5 is a structural diagram of a driving circuit according to at least one embodiment of the present disclosure.

As shown in FIG. 5, on the basis of at least one embodiment of the driving circuit shown in FIG. 1, the driving circuit described in at least one embodiment of the present disclosure may further include a second pull-down node PD2 and a second control circuit 51;

The second control circuit 51 is electrically connected to the second pull-down node PD2, the second control terminal Tr2, and the fifth voltage terminal V5, respectively, and is used to control to connect the second pull-down node PD2 and the fifth voltage terminal V5 under the control of the second control signal provided by the second control terminal Tr2, so that the potential of the second pull-down node PD2 is a valid voltage;

The pull-up node reset circuit 12 is also electrically connected to the second pull-down node PD2, and is used to control to connect the pull-up node PU and the second voltage terminal V2 when the potential of the second pull-down node PD2 is a valid voltage, so as to reset the potential of the pull-up node PU.

Optionally, the second control circuit includes a third transistor; the pull-up node reset circuit further includes a fourth transistor;

The gate electrode of the third transistor is electrically connected to the second control terminal, the first electrode of the third transistor is electrically connected to the second pull-down node, and the second electrode of the third transistor is electrically connected to the fifth voltage terminal;

The gate electrode of the fourth transistor is electrically connected to the second pull-down node, the first electrode of the fourth transistor is electrically connected to the pull-up node, and the second electrode of the fourth transistor is electrically connected to the second voltage terminal.

Figure 6:
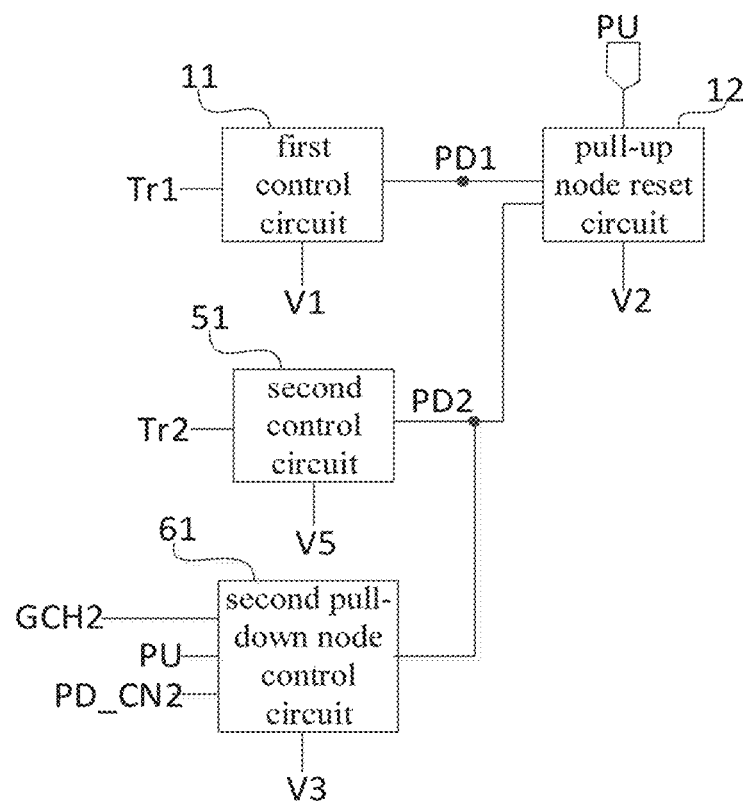
FIG. 6 is a structural diagram of a driving circuit according to at least one embodiment of the present disclosure.

As shown in FIG. 6, on the basis of the driving circuit shown in FIG. 5, the driving circuit described in at least one embodiment of the present disclosure may further include a second pull-down node control circuit 61;

The second pull-down node control circuit 61 is electrically connected to the second pull-down node PD2, the second pull-down control node PD_CN2, the pull-up node PU, the second control voltage terminal GCH2, and the third voltage terminal V3, respectively, is configured to control to connect the second control voltage terminal GCH2 and the second pull-down control node PD_CN2 under the control of the second control voltage provided by the second control voltage terminal GCH2, control to connect the second pull-down control node PD_CN2 and the third voltage terminal V3 under the control of the potential of the pull-up node PU, control to connect the second pull-down node PD2 and the second control voltage terminal GCH2 under the control of the potential of the second pull-down control node PD_CN2, and control to connect the second pull-down node PD2 and the third voltage terminal V3 under the control of the potential of the pull-up node PU.

In at least one embodiment of the driving circuit shown in FIG. 6, the fifth voltage terminal is the second control voltage terminal GCH2, but not limited thereto.

When the driving circuit shown in FIG. 6 of the present disclosure is working, the second pull-down node control circuit 61 controls the potential of the second pull-down node PD2 and the potential of the second pull-down control node PD_CN2 under the control of the potential of the pull-up node PU and the second control voltage.

The driving circuit described in at least one embodiment of the present disclosure may further include an input circuit, an output reset circuit, an initial reset circuit, and an energy storage circuit;

The input circuit is respectively electrically connected to the input terminal, the second input voltage terminal and the pull-up node, and is used to control write the second input voltage provided by the second input voltage terminal into the pull-up node under the control of the input signal provided by the input terminal.

The output reset circuit is electrically connected to a frame reset terminal, the driving signal output terminal and a fourth voltage terminal respectively, and is used to control to connect the driving signal output terminal and the fourth voltage terminal under the control of a frame reset signal provided by the frame reset terminal.

The initial reset circuit is electrically connected to the initial reset terminal, the pull-up node and a fourth voltage terminal, and is used to control to connect the pull-up node and the fourth voltage terminal under the control of the initial reset signal provided by the initial reset terminal.

A first end of the energy storage circuit is electrically connected to the pull-up node, a second end of the energy storage circuit is electrically connected to the driving signal output terminal, and the energy storage circuit is used for storing electric energy.

In at least one embodiment of the present disclosure, the fourth voltage terminal may be a low voltage terminal, and the second voltage terminal, the third voltage terminal and the fourth voltage terminal may be the same voltage terminal, but not This is the limit.

When the driving circuit described in at least one embodiment of the present disclosure is working, the input circuit writes the second input voltage into the pull-up node under the control of the input signal, and the output reset circuit resets the driving signal provided by the driving signal output terminal under the control of the frame reset signal, and the initial reset circuit resets the potential of the pull-up node under the control of the initial reset signal.

Figure 7:
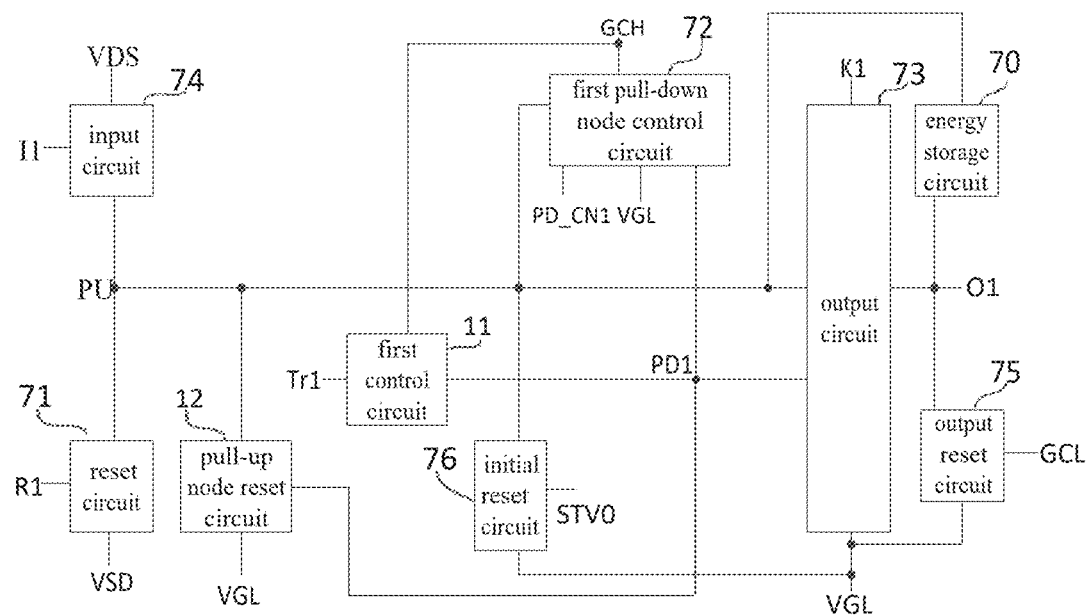
FIG. 7 is a structural diagram of a driving circuit according to at least one embodiment of the present disclosure.

As shown in FIG. 7, on the basis of at least one embodiment of the driving circuit described in FIG. 1, the driving circuit described in at least one embodiment of the present disclosure further includes a reset circuit 71, a first pull-down node control circuit 72, an output circuit 73, an input circuit 74, an output reset circuit 75, an initial reset circuit 76 and an energy storage circuit 70; the second voltage terminal is the low voltage terminal VGL, and the first voltage terminal is the first control voltage terminal GCH;

The reset circuit 71 is electrically connected to the reset terminal R1, the pull-up node PU and the first input voltage terminal VSD respectively, and is used to control to write a first input voltage provided by the first input voltage terminal VSD into the pull-up node PU under the control of the reset signal provided by the reset terminal R1;

The first pull-down node control circuit 72 is electrically connected to the first pull-down node PD1, the first pull-down control node PD_CN1, the pull-up node PU, the first control voltage terminal GCH and the low voltage terminal VGL respectively, is configured to control to connect the first control voltage terminal GCH and the first pull-down control node PD_CN1 under the control of the first control voltage provided by the first control voltage terminal GCH, and control to connect the first pull-down control node PD_CN1 and the low voltage terminal VGL1 under the control of the potential of the pull-up node PU, and control to connect the first pull-down node PD1 and the first control voltage terminal GCH under the control of the potential of the first pull-down control terminal PD_CN1, and control to connect the first pull-down node PD1 and the low voltage terminal VGL under the control of the potential of the pull-up node PU;

The output circuit 73 is electrically connected to the pull-up node PU, the first pull-down node PD1, the output clock signal terminal K1, the low voltage terminal VGL, and the driving signal output terminal O1, respectively, and is configured to control to write the output clock signal provided by the output clock signal terminal K1 into the driving signal output terminal O1 under the control of the potential of the pull-up node PU, and control to connect the driving signal output terminal O1 and the low voltage terminal VGL under the control of the potential of the first pull-down node PD1;

The input circuit 74 is electrically connected to the input terminal I1, the second input voltage terminal VDS and the pull-up node PU, and is used to control to write the second input voltage provided by the second input voltage terminal VDS into the pull-up node PU under the control of the input signal provided by the input terminal I1;

The output reset circuit 75 is electrically connected to the frame reset terminal GCL, the driving signal output terminal O1 and the low voltage terminal VGL respectively, and is used to control to connect the driving signal output terminal O1 and the low voltage terminal VGL under the control of the frame reset signal provided by the frame reset terminal GCL;

The initial reset circuit 76 is electrically connected to the initial reset terminal STV0, the pull-up node PU and the low voltage terminal VGL respectively, and is used to control to connect the pull-up node PU and the low voltage terminal VGL under the control of the initial reset signal provided by the initial reset terminal STV0;

The first end of the energy storage circuit 70 is electrically connected to the pull-up node PU, the second end of the energy storage circuit 70 is electrically connected to the driving signal output terminal O1, and the energy storage circuit 70 is used for storing electrical energy.

Optionally, the reset circuit includes a fifth transistor;

A gate electrode of the fifth transistor is electrically connected to the reset terminal, a first electrode of the fifth transistor is electrically connected to the pull-up node, and a second electrode of the fifth transistor is electrically connected to the first input voltage terminal.

Optionally, the first pull-down node control circuit includes a sixth transistor, a seventh transistor, an eighth transistor, and a ninth transistor;

Both a gate electrode of the sixth transistor and a first electrode of the sixth transistor are electrically connected to the first control voltage terminal, and a second electrode of the sixth transistor is electrically connected to the first pull-down control node;

A gate electrode of the seventh transistor is electrically connected to the pull-up node, a first electrode of the seventh transistor is electrically connected to the first pull-down control node, and a second electrode of the seventh transistor is electrically connected to the third voltage terminal;

A gate electrode of the eighth transistor is electrically connected to the first pull-down control node, a first electrode of the eighth transistor is electrically connected to the first control voltage terminal, and a second electrode of the eighth transistor is electrically connected to the first pull-down node;

A gate electrode of the ninth transistor is electrically connected to the pull-up node, a first electrode of the ninth transistor is electrically connected to the first pull-down node, and a second electrode of the ninth transistor is electrically connected to the third voltage terminal.

Optionally, the second pull-down node control circuit includes a tenth transistor, an eleventh transistor, a twelfth transistor, and a thirteenth transistor;

Both a gate electrode of the tenth transistor and a first electrode of the tenth transistor are electrically connected to the second control voltage terminal, and a second electrode of the tenth transistor is electrically connected to the second pull-down control node;

A gate electrode of the eleventh transistor is electrically connected to the pull-up node, a first electrode of the eleventh transistor is electrically connected to the second pull-down control node, and a second electrode of the eleventh transistor is electrically connected to the third voltage terminal;

A gate electrode of the twelfth transistor is electrically connected to the second pull-down control node, a first electrode of the twelfth transistor is electrically connected to the second control voltage terminal, and a second electrode of the twelfth transistor is electrically connected to the second pull-down node;

A gate electrode of the thirteenth transistor is electrically connected to the pull-up node, a first electrode of the thirteenth transistor is electrically connected to the second pull-down node, and a second electrode of the tenth transistor is electrically connected to the third voltage terminal.

Optionally, the input circuit includes a fourteenth transistor;

A gate electrode of the fourteenth transistor is electrically connected to the input terminal, a first electrode of the fourteenth transistor is electrically connected to the second input voltage terminal, and a second electrode of the fourteenth transistor is electrically connected to the pull-up node;

The output circuit includes a fifteenth transistor and a sixteenth transistor;

A gate electrode of the fifteenth transistor is electrically connected to the pull-up node, a first electrode of the fifteenth transistor is electrically connected to the output clock signal terminal, and a second electrode of the fifteenth transistor is electrically connected to the driving signal output terminal;

A gate electrode of the sixteenth transistor is electrically connected to the first pull-down node, a first electrode of the sixteenth transistor is electrically connected to the driving signal output terminal, and a second electrode of the sixteenth transistor electrically connected to the fourth voltage terminal;

The output reset circuit includes a seventeenth transistor;

A gate electrode of the seventeenth transistor is electrically connected to the frame reset terminal, a first electrode of the seventeenth transistor is electrically connected to the driving signal output terminal, and a second electrode of the seventeenth transistor is electrically connected to the fourth voltage terminal;

The pull-down node reset circuit includes an eighteenth transistor;

A gate electrode of the eighteenth transistor is electrically connected to the pull-up node, a first electrode of the eighteenth transistor is electrically connected to the first pull-down node, and a second electrode of the eighteenth transistor is electrically connected to the third voltage terminal;

The initial reset circuit includes a nineteenth transistor;

A gate electrode of the nineteenth transistor is electrically connected to the initial reset terminal, a first electrode of the nineteenth transistor is electrically connected to the pull-up node, and a second electrode of the nineteenth transistor is electrically connected to the fourth voltage terminal;

The energy storage circuit includes a storage capacitor;

A first end of the storage capacitor is electrically connected to the pull-up node, and a second end of the storage capacitor is electrically connected to the driving signal output terminal.

Figure 8:
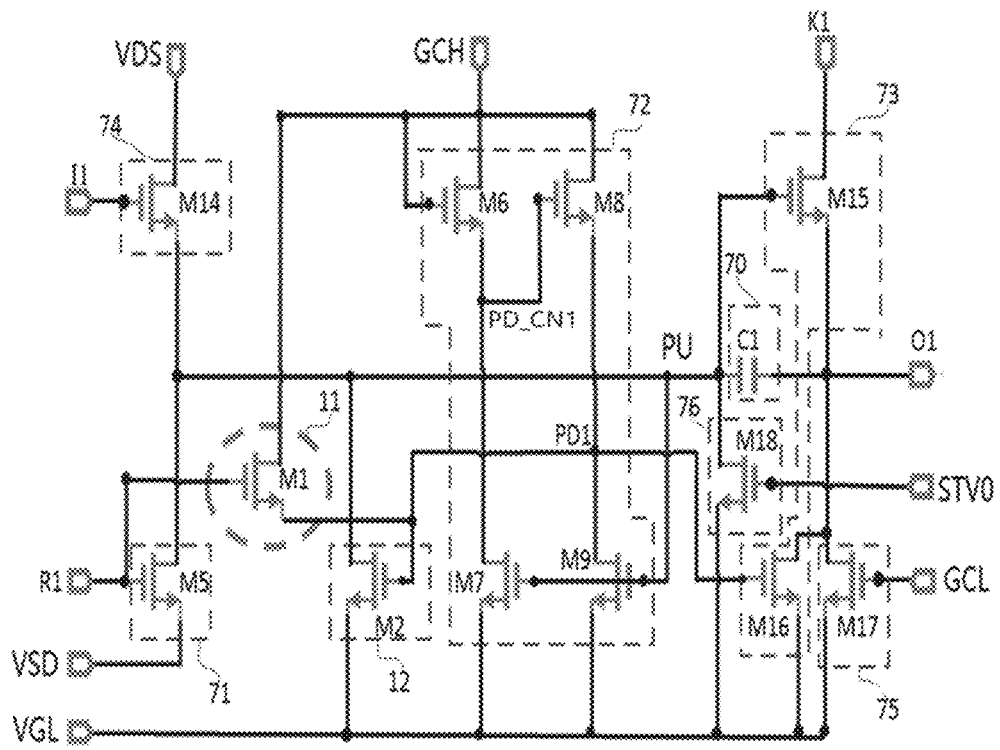
FIG. 8 is a circuit diagram of a driving circuit according to at least one embodiment of the present disclosure.

As shown in FIG. 8, on the basis of at least one embodiment of the driving circuit shown in FIG. 7, the first control circuit 11 includes a first transistor M1; the first control terminal is electrically connected to the reset terminal R1, the reset terminal R1 refers to: when including a plurality of cascaded driving circuits, if the driving circuit of the current stage is the nth stage, for forward scanning, the reset terminal is connected to the output terminal of the (n+i)th stage of driving circuit, wherein i can be a positive integer greater than or equal to 1, for the driving circuit in which the cascaded output terminal and the gate scanning output terminal are separately output, the reset terminal can be the signal terminal connected to the cascaded output terminal;

The gate electrode of the first transistor M1 is electrically connected to the reset terminal R1, the source electrode of the first transistor M1 is electrically connected to the first pull-down node PD1, and the drain electrode of the first transistor M1 is electrically connected to the first control voltage terminal GCH;

The pull-up node reset circuit 12 includes a second transistor M2;

The gate electrode of the second transistor M2 is electrically connected to the first pull-down node PD1, the source electrode of the second transistor M2 is electrically connected to the pull-up node PU, and the drain electrode of the second transistor M2 is electrically connected to the low voltage terminal VGL;

The reset circuit 71 includes a fifth transistor M5;

The gate electrode of the fifth transistor M5 is electrically connected to the reset terminal R1, the source electrode of the fifth transistor M5 is electrically connected to the pull-up node PU, and the drain electrode of the fifth transistor M5 is electrically connected to the first input voltage terminal VSD;

The first pull-down node control circuit 72 includes a sixth transistor M6, a seventh transistor M7, an eighth transistor M8 and a ninth transistor M9;

Both the gate electrode of the sixth transistor M6 and the source electrode of the sixth transistor M6 are electrically connected to the first control voltage terminal GCH, and the drain electrode of the sixth transistor M6 is connected to the first pull-down control node PD_CN1;

The gate electrode of the seventh transistor M7 is electrically connected to the pull-up node PU, the source electrode of the seventh transistor M7 is electrically connected to the first pull-down control node PD_CN1, and the drain electrode of the seventh transistor M7 is electrically connected to the low voltage terminal VGL;

The gate electrode of the eighth transistor M8 is electrically connected to the first pull-down control node PD_CN1, the source electrode of the eighth transistor M8 is electrically connected to the first control voltage terminal GCH, and the drain electrode of the eighth transistor M8 is electrically connected to the first pull-down node PD1;

The gate electrode of the ninth transistor M9 is electrically connected to the pull-up node PU, the source electrode of the ninth transistor M9 is electrically connected to the first pull-down node PD1, and the drain electrode of the ninth transistor M9 is electrically connected to the low voltage terminal VGL;

The input circuit 74 includes a fourteenth transistor M14;

The gate electrode of the fourteenth transistor M14 is electrically connected to the input terminal I1, the source electrode of the fourteenth transistor M14 is electrically connected to the second input voltage terminal VDS, and the drain electrode of the fourteenth transistor M14 electrode is electrically connected to the pull-up node PU;

The output circuit 73 includes a fifteenth transistor M15 and a sixteenth transistor M16;

The gate electrode of the fifteenth transistor M15 is electrically connected to the pull-up node PU, the source electrode of the fifteenth transistor M15 is electrically connected to the output clock signal terminal K1, and the drain electrode of the fifteenth transistor M15 is electrically connected to the driving signal output terminal O1;

The gate electrode of the sixteenth transistor M16 is electrically connected to the first pull-down node PD1, the source electrode of the sixteenth transistor M16 is electrically connected to the driving signal output terminal O1, and the drain electrode of the sixteenth transistor M16 is electrically connected to the low voltage terminal VGL;

The output reset circuit 75 includes a seventeenth transistor M17;

The gate electrode of the seventeenth transistor M17 is electrically connected to the frame reset terminal GCL, the source electrode of the seventeenth transistor M17 is electrically connected to the driving signal output terminal O1, and the drain electrode of the seventeenth transistor M17 is electrically connected to the low voltage terminal VGL;

The initial reset circuit 76 includes an eighteenth transistor M18;

The gate electrode of the eighteenth transistor M18 is electrically connected to the initial reset terminal STV0, the source electrode of the eighteenth transistor M18 is electrically connected to the pull-up node PU, and the drain electrode of the eighteenth transistor M18 electrically connected to the low voltage terminal VGL;

The energy storage circuit 70 includes a storage capacitor C1;

A first end of the storage capacitor C1 is electrically connected to the pull-up node PU, and a second end of the storage capacitor C1 is electrically connected to the driving signal output terminal O1.

On the basis of at least one embodiment of the driving circuit shown in FIG. 8, all transistors are n-type thin film transistors, but not limited thereto.

At least one embodiment of the driving circuit shown in FIG. 8 of the present disclosure is capable of performing bidirectional scanning;

When VDS provides a high voltage signal and VSD provides a low voltage signal, the driving circuit can perform forward scanning;

When VDS provides a low voltage signal and VSD provides a high voltage signal, the driving circuit can perform backward scanning.

Figure 9:
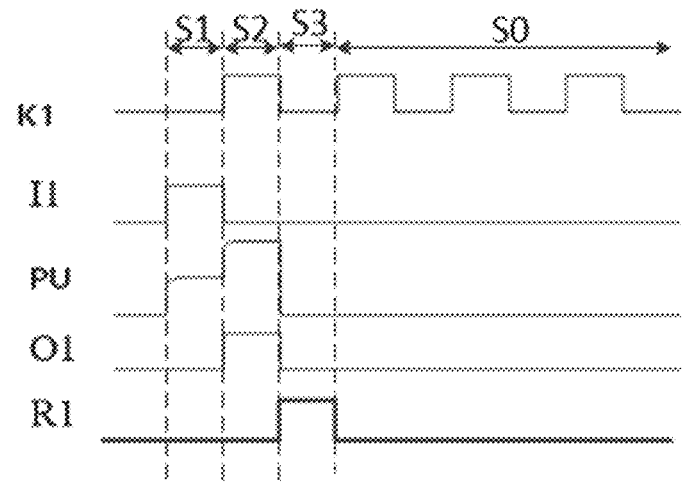
FIG. 9 is a work timing diagram of the driving circuit shown in FIG. 8 of at least one embodiment of the present disclosure.

As shown in FIG. 9, when the driving circuit shown in FIG. 8 is working, by taking VDS to provide a high voltage signal and VSD to provide a low voltage signal as an example; the display period may include an input phase S1, an output phase S2 and a reset phase S3 set sequentially;

In the input phase S1, K1 provides a low voltage signal, I1 provides a high voltage signal, R1 provides a low voltage signal, GCH provides a high voltage signal, M1 is turned off, M14 is turned on, and the high voltage signal provided by VDS is written into the pull-up node PU, so that the potential of PU increases by a first order, M15 is turned on, and O1 outputs a low voltage signal;

In the input phase S1, M6 and M7 are turned on to control the potential of PD_CN1 to be a low voltage, M8 is turned off, and M9 is turned on to control the potential of PD1 to be a low voltage;

In the output phase S2, K1 provides a high voltage signal, I1 provides a low voltage signal, R1 provides a high voltage signal, GCH provides a high voltage signal, the potential of PU is raised by the second order due to the coupling effect of C1, M15 continues to be turned on, and O1 outputs high voltage signal, and provide an input signal for the adjacent next stage of driving circuit;

In the reset phase S3, K1 provides a low voltage signal, I1 provides a low voltage signal, R1 provides a high voltage signal, GCH provides a high voltage signal, and M5 is turned on to reset the potential of the PU and pull down the potential of the PU;

In the reset phase S3, M6 is turned on, M7 is turned off, the potential of PD_CN1 is a high voltage, M8 is turned on, M9 is turned off, the potential of PD1 is a high voltage, M2 and M16 are turned on, so that the PU and VGL are connected, and the O1 outputs a low voltage signal.

In FIG. 9, the one labeled S0 is the output cut-off maintenance phase, and in the output cut-off maintenance phase S0, O1 continues to output a low voltage signal.

When at least one embodiment of the driving circuit shown in FIG. 8 of the present disclosure is working, in the reset phase S3, R1 provides a high voltage signal, GCH provides a high voltage signal, and M1 is turned on to pull up the potential of PD1.

Figure 10:
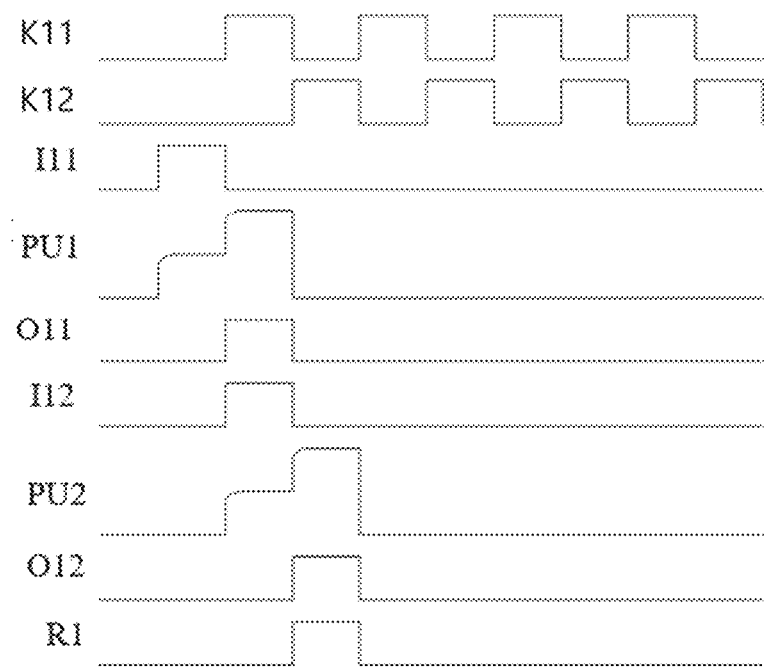
FIG. 10 is a work timing diagram of adjacent two stages of driving circuits.

FIG. 10 is a work timing diagram of adjacent two stages of driving circuits. In FIG. 0, K11 is the clock signal connected to the first stage of driving circuit, K12 is the clock signal connected to the second stage of driving circuit, and PU1 is the pull-up node in the first stage of driving circuit, I11 is the input signal connected to the input terminal of the first stage of driving circuit, and O11 is the driving signal output terminal of the first-level driving circuit;

K12 is the clock signal connected to the second stage of driving circuit, PU2 is the pull-up node in the second stage of driving circuit, I12 is the input signal connected to the input terminal of the second stage of driving circuit, and O12 is the driving signal output terminal of the second stage of driving circuit, R11 is the reset signal connected to the reset terminal of the first stage of driving circuit.

Figure 11A:
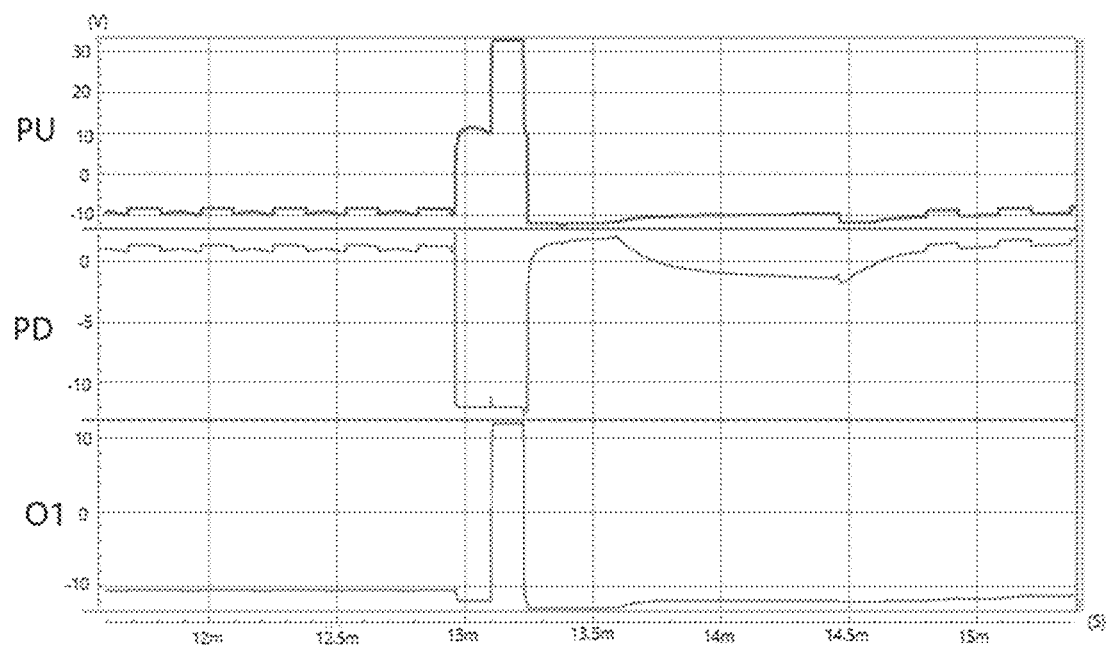
FIG. 11A is the simulation waveform of the relevant driving circuit under the reliability test.
Figure 11B:
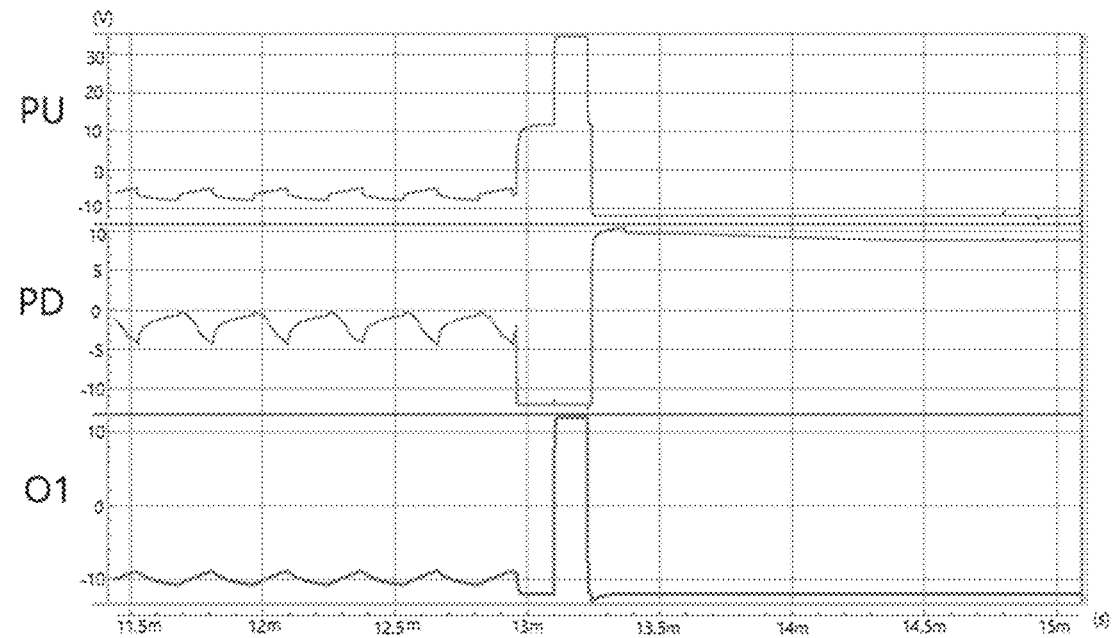
FIG. 11B is a comparison of simulation waveforms of the driving circuit shown in FIG. 8 under the same reliability conditions.

At least one embodiment of the driving circuit shown in FIG. 8 of the present disclosure is added with a first transistor M1, which can be turned on when the reset signal arrives, and the high level provided by GCH further pulls up the potential of PD1. FIG. 11A is a simulation waveform of a related driving circuit under a reliability test, and FIG. 11B is a comparison of simulation waveforms of the driving circuit shown in FIG. 8 under the same reliability condition.

When the driving circuit shown in FIG. 8 is working, the high potential of PD1 is increased from 1V in the related art to 9V. After the reset signal arrives, the potential of PU and the noise of the driving signal output by O1 are reduced.

Figure 12A:
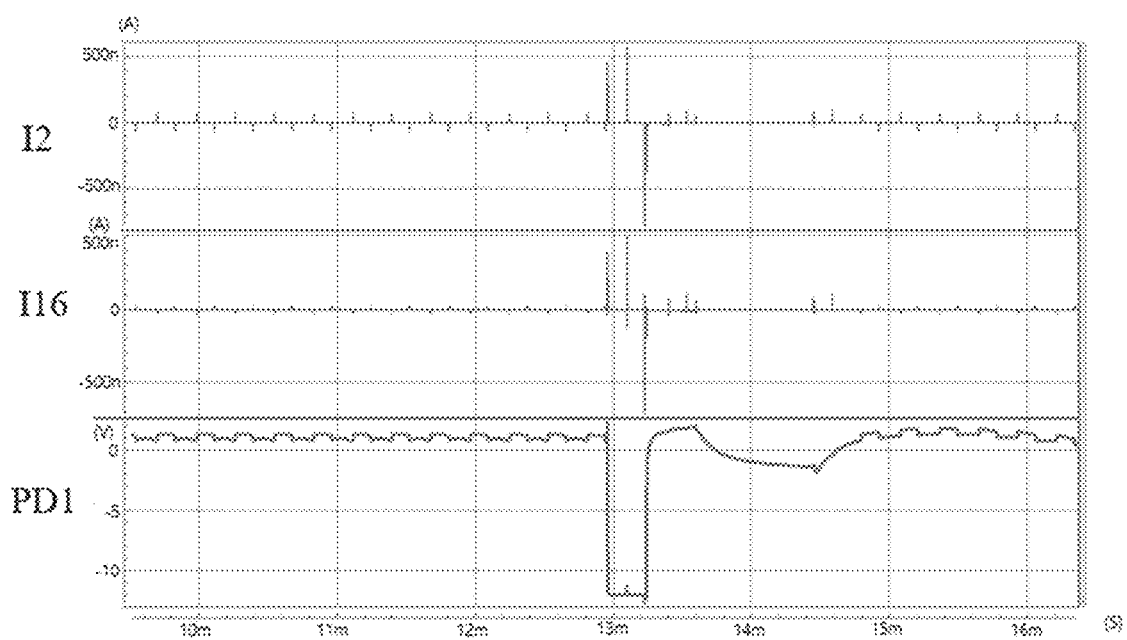
FIG. 12A is a waveform diagram of the current I1 of M2 and the current I16 of M16 of the related driving circuit after the reliability test.
Figure 12B:
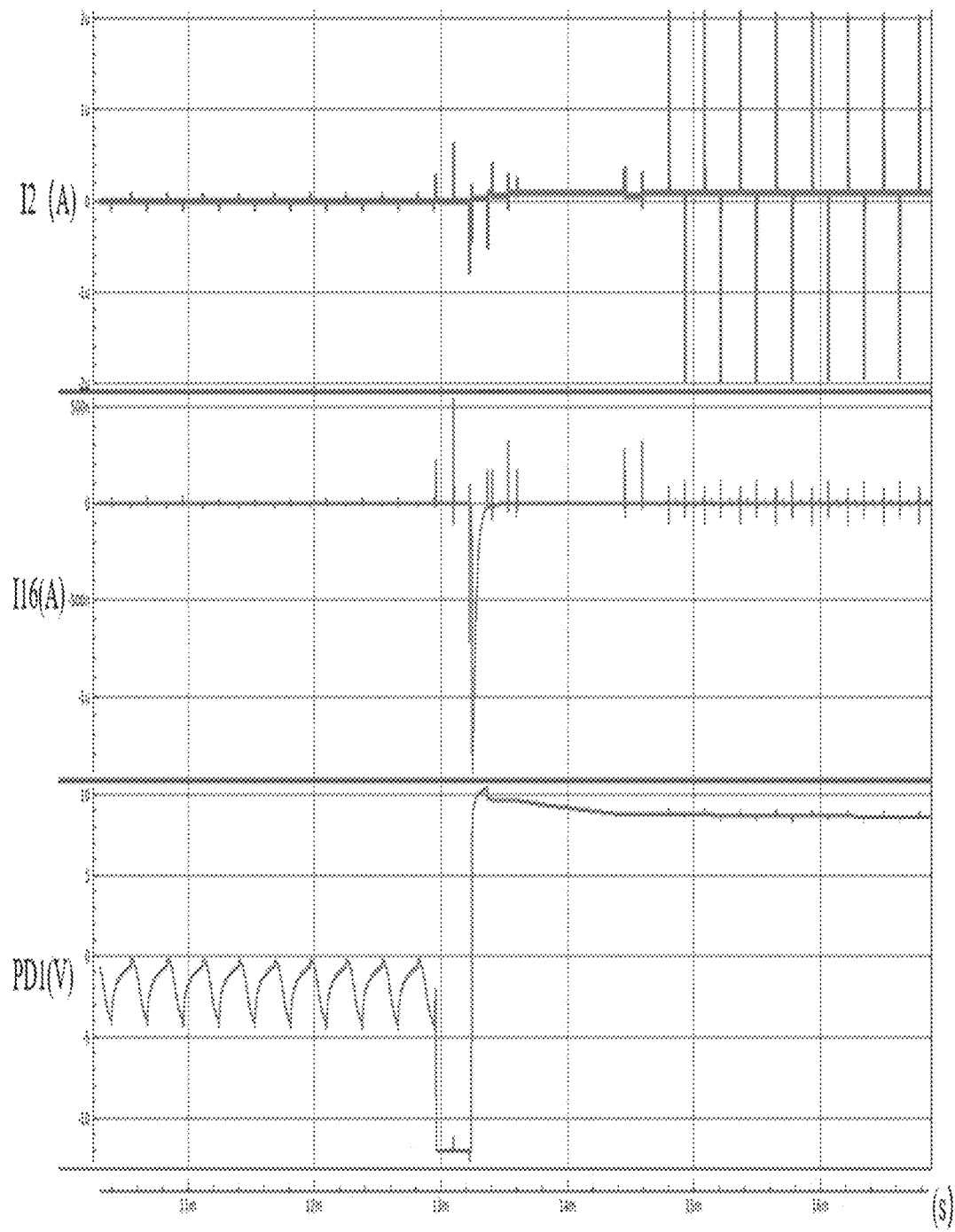
FIG. 12B is a waveform diagram of the current I2 of M2 and the current I16 of M16 after the reliability test of the driving circuit shown in FIG. 8.

FIG. 12A is a waveform diagram of the current I1 of M2 and the current I16 of M16 of the related driving circuit after the reliability test, and FIG. 12B is the waveform diagram of current I2 of M2 and current I16 of M16 of the driving circuit shown in FIG. 8 after the reliability test.

After the reliability test of the relevant driving circuit, I2 and I16 are very small, in the driving circuit shown in FIG. 8, during the period that the potential of PD1 is high after the reset signal arrives, M2 has significantly high current, noise reduction ability of M2 is enhanced.

Figure 13A:
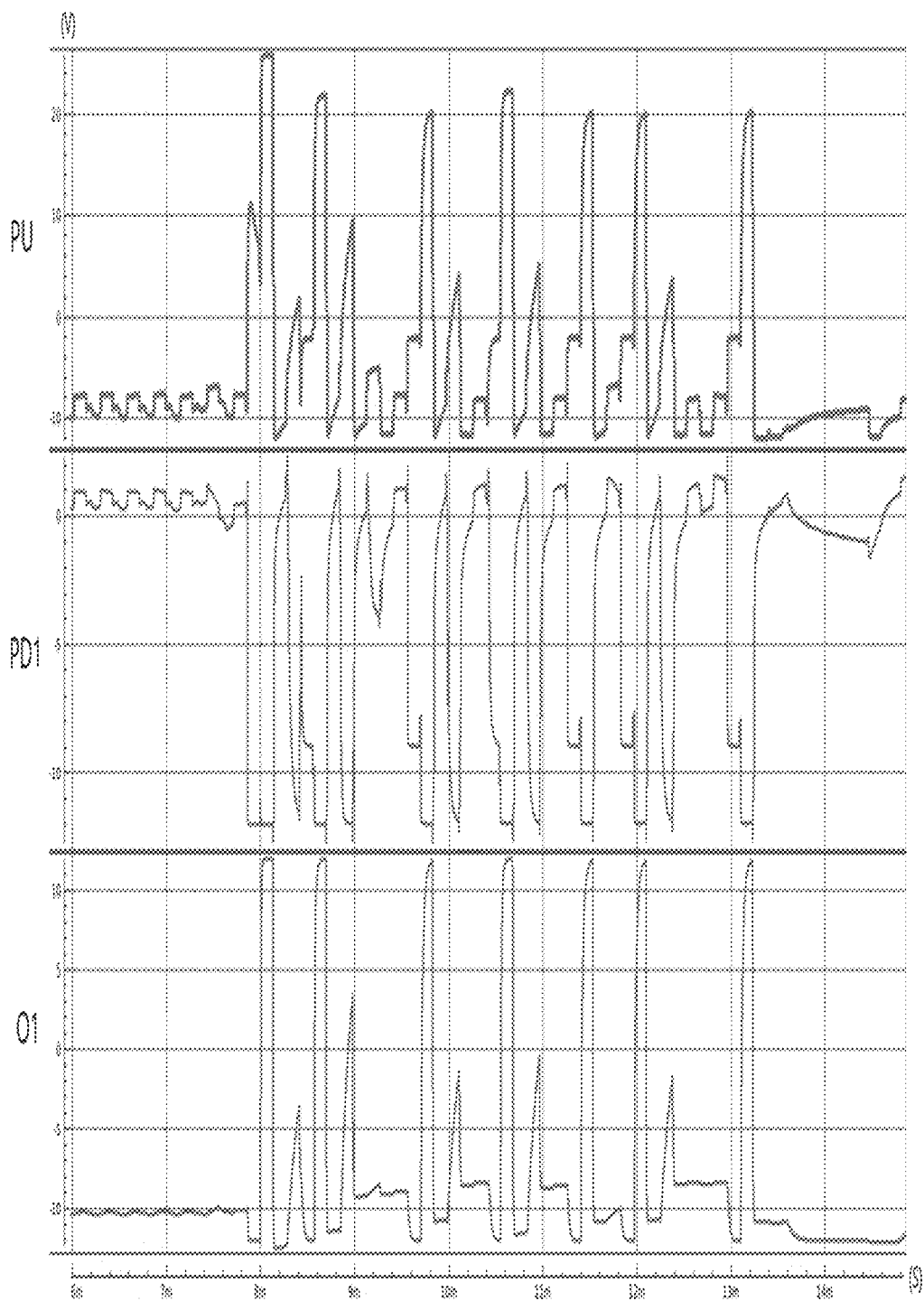
FIG. 13A is a waveform diagram of the potential of PU, the potential of PD1 and the driving signal output by O1 after the reliability test of the relevant driving circuit.
Figure 13B:
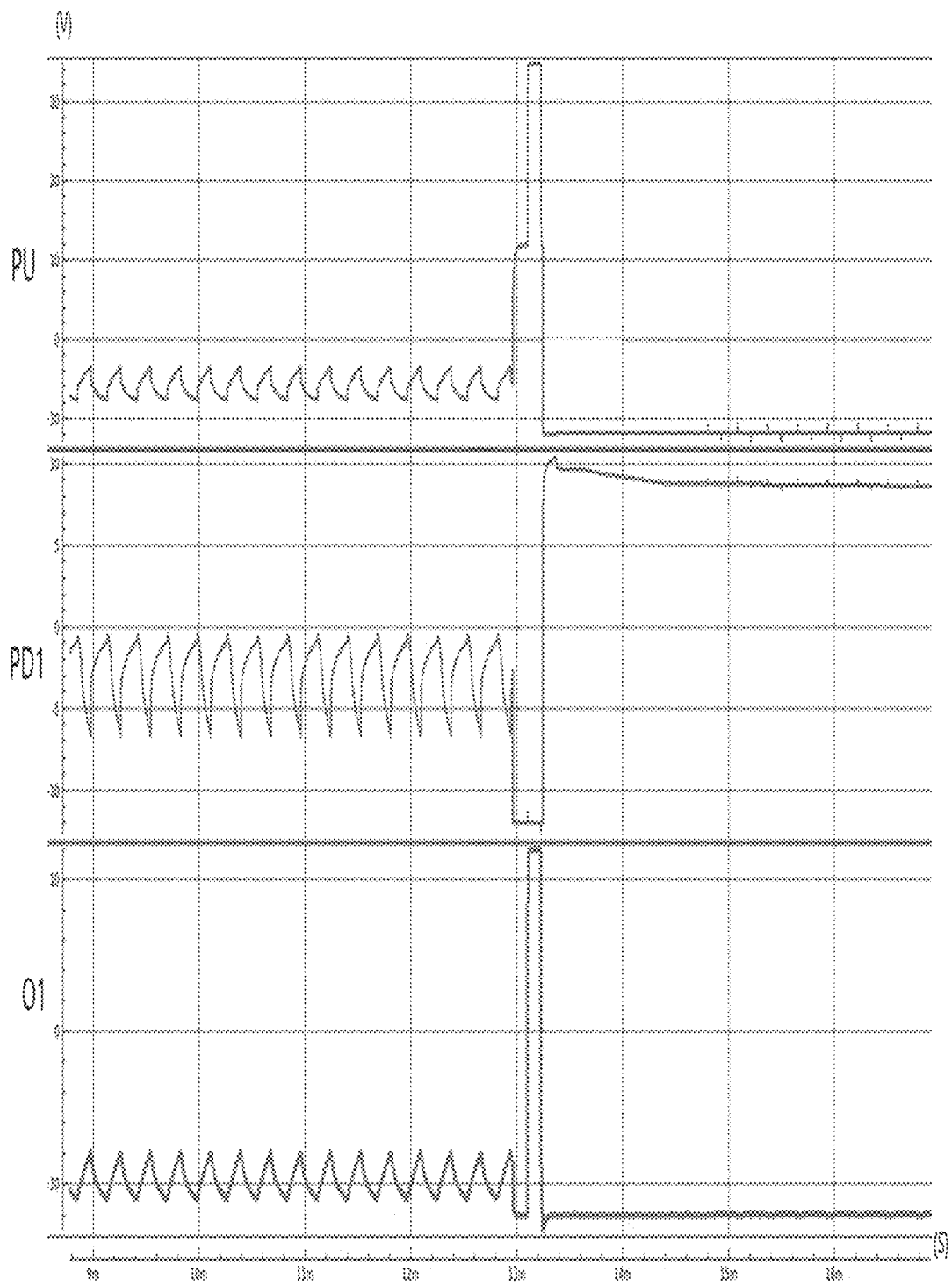
FIG. 13B is a waveform diagram of the potential of PU, the potential of PD1, and the driving signal output by O1 after the reliability test of the driving circuit shown in FIG. 8.

FIG. 13A is a waveform diagram of the potential of PU, the potential of PD1 and the driving signal output by O1 after the reliability test of the relevant driving circuit. FIG. 13B is a waveform diagram of the potential of PU, the potential of PD1 and the driving signal output by O1 of the driving circuit shown in FIG. 8 after the reliability test.

In at least one embodiment of the present disclosure, the reliability test may be a high temperature and high humidity reliability test; for example, the reliability test may be a high temperature reliability test at a temperature greater than or equal to 60° C. Optionally, the reliability test may be a high temperature reliability test at 85° C.; but it is not limited thereto.

After the reliability test, when the negative bias of the threshold voltage of M14 increases to the same extent, the driving signal output by the relevant driving circuit have multi-output, and in the driving circuit shown in FIG. 8, the driving signal is output correctly, and there is still little noise after the reset signal arrives.

In at least one embodiment of the present disclosure, when the related driving circuit outputs normally, within one display period (the one display period may be, for example, one frame time), the driving signal output by the related driving circuit has only one upward pulse. However, when the driving signal output by the related driving circuit has multi-output, in one display period, the driving signal output by the related driving circuit has multiple upward pulses. As shown in FIG. 13A, within a display period, the driving signal output by O1 has multiple upward pulses, so that multiple output occurs.

Figure 14:
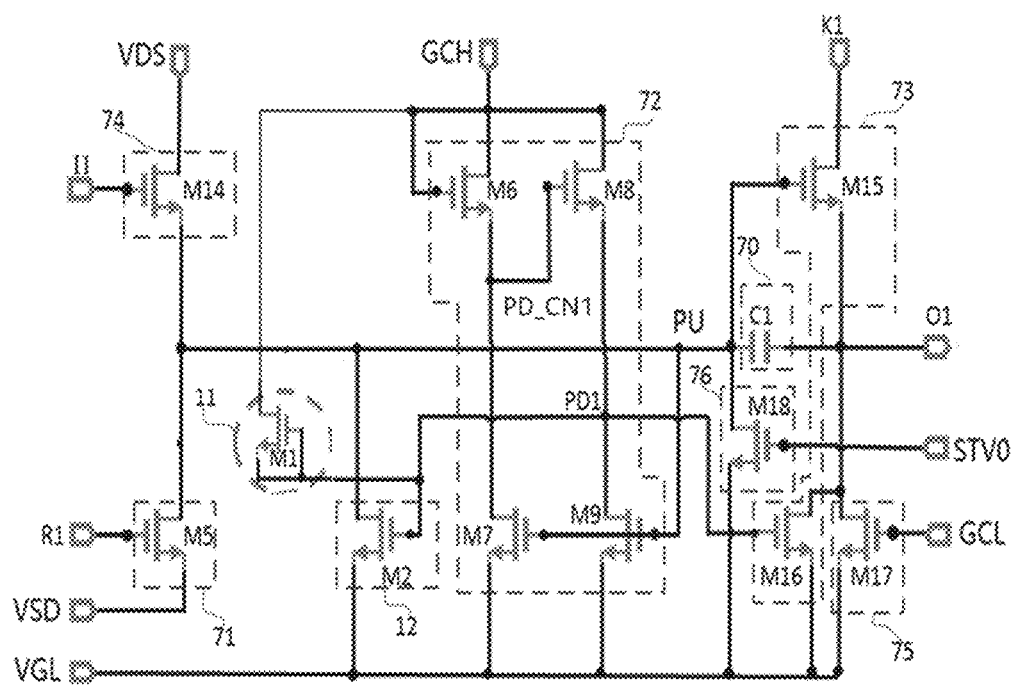
FIG. 14 is a circuit diagram of a driving circuit according to at least one embodiment of the present disclosure.

The difference between the driving circuit shown in FIG. 14 and the driving circuit shown in FIG. 8 is that the gate electrode of M1 is electrically connected to the first pull-down node PD1.

At least one embodiment of the driving circuit shown in FIG. 14 is working, when the potential of PU is a low voltage and the potential of PD1 is a high voltage, M1 is turned on, and the potential of PD1 is further pulled up by the first control voltage provided by GCH.

At least one embodiment of the driving circuit shown in FIG. 14 of the present disclosure is added with a first transistor M1, which can turn on M1 when the potential of PD1 is a high voltage, and further pull up the potential of PD1 through the high level provided by GCH.

Figure 15A:
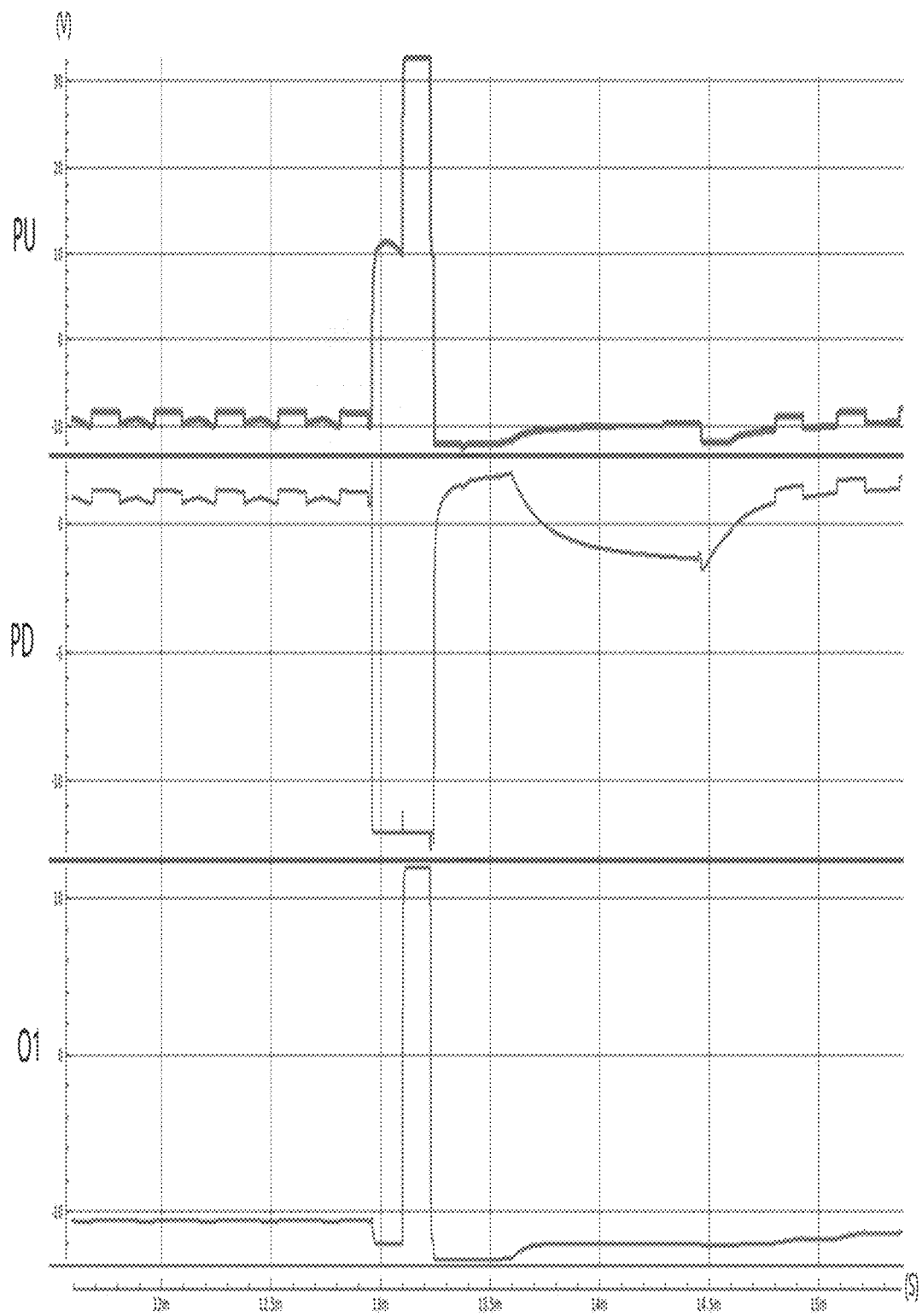
FIG. 15A is the simulation waveform of the relevant driving circuit under the reliability test.
Figure 15B:
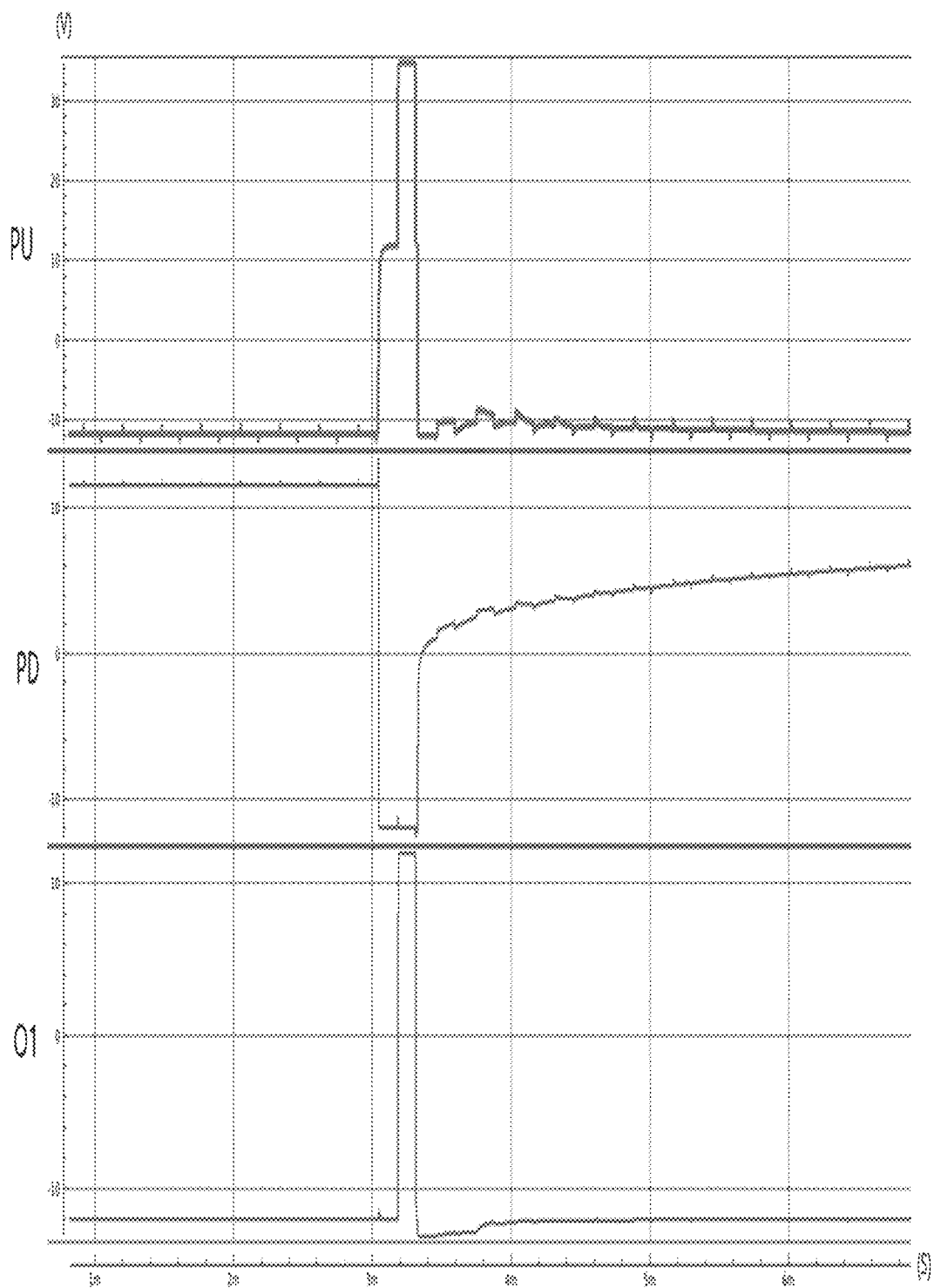
FIG. 15B is a comparison of simulation waveforms of the driving circuit shown in FIG. 8 under the same reliability conditions.

FIG. 15A is a simulation waveform of a related driving circuit under a reliability test, and FIG. 15B is a comparison of simulation waveforms of the driving circuit shown in FIG. 8 under the same reliability conditions.

When the driving circuit shown in FIG. 14 of the present disclosure is working, the high potential of PD1 is increased from 1V in the related art to 11.5V. After the reset signal arrives, the potential of PU and the noise of the driving signal output by O1 decrease.

Figure 16A:
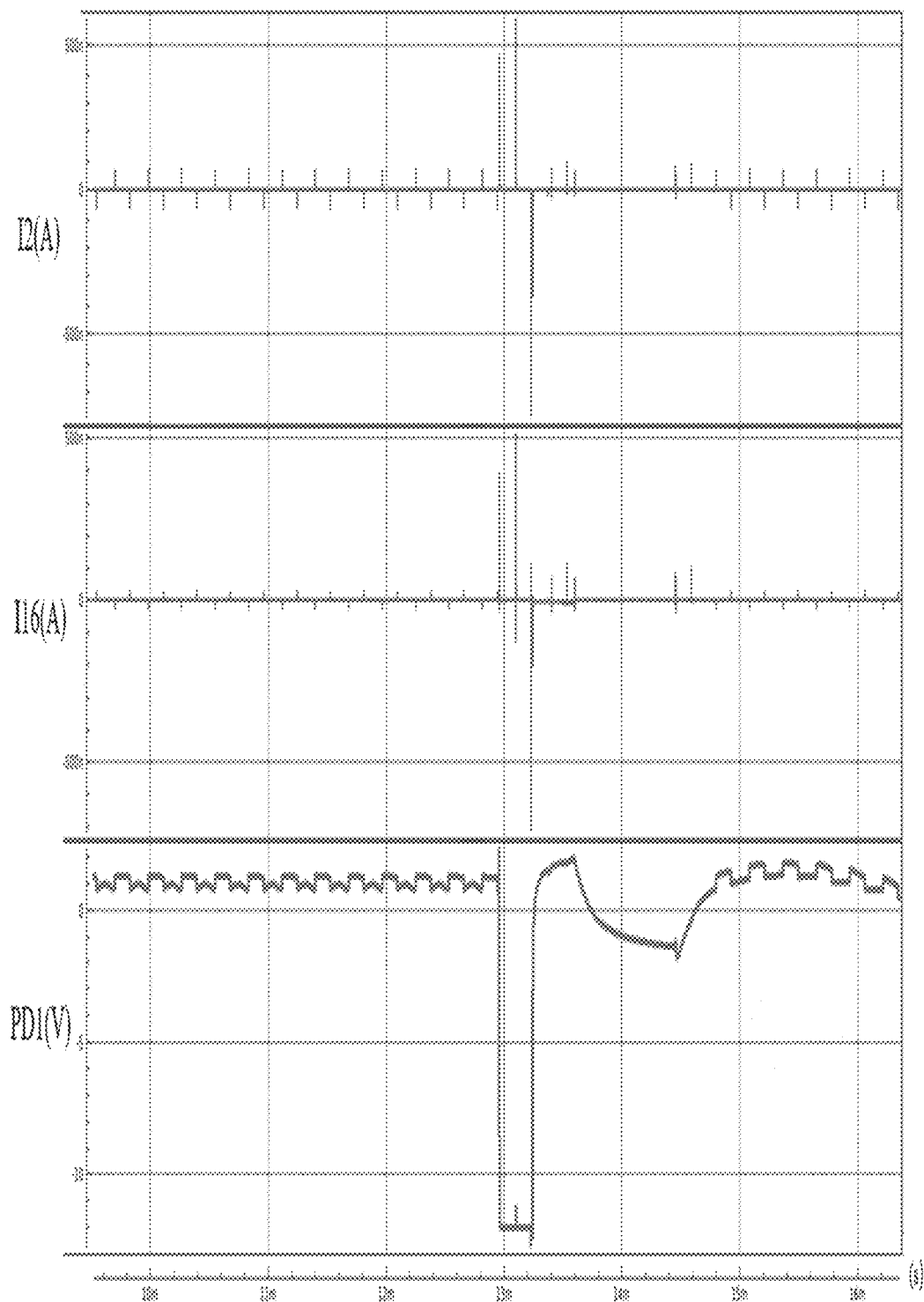
FIG. 16A is a waveform diagram of the current I1 of M2 and the current I16 of M16 of the related driving circuit after the reliability test.
Figure 16B:
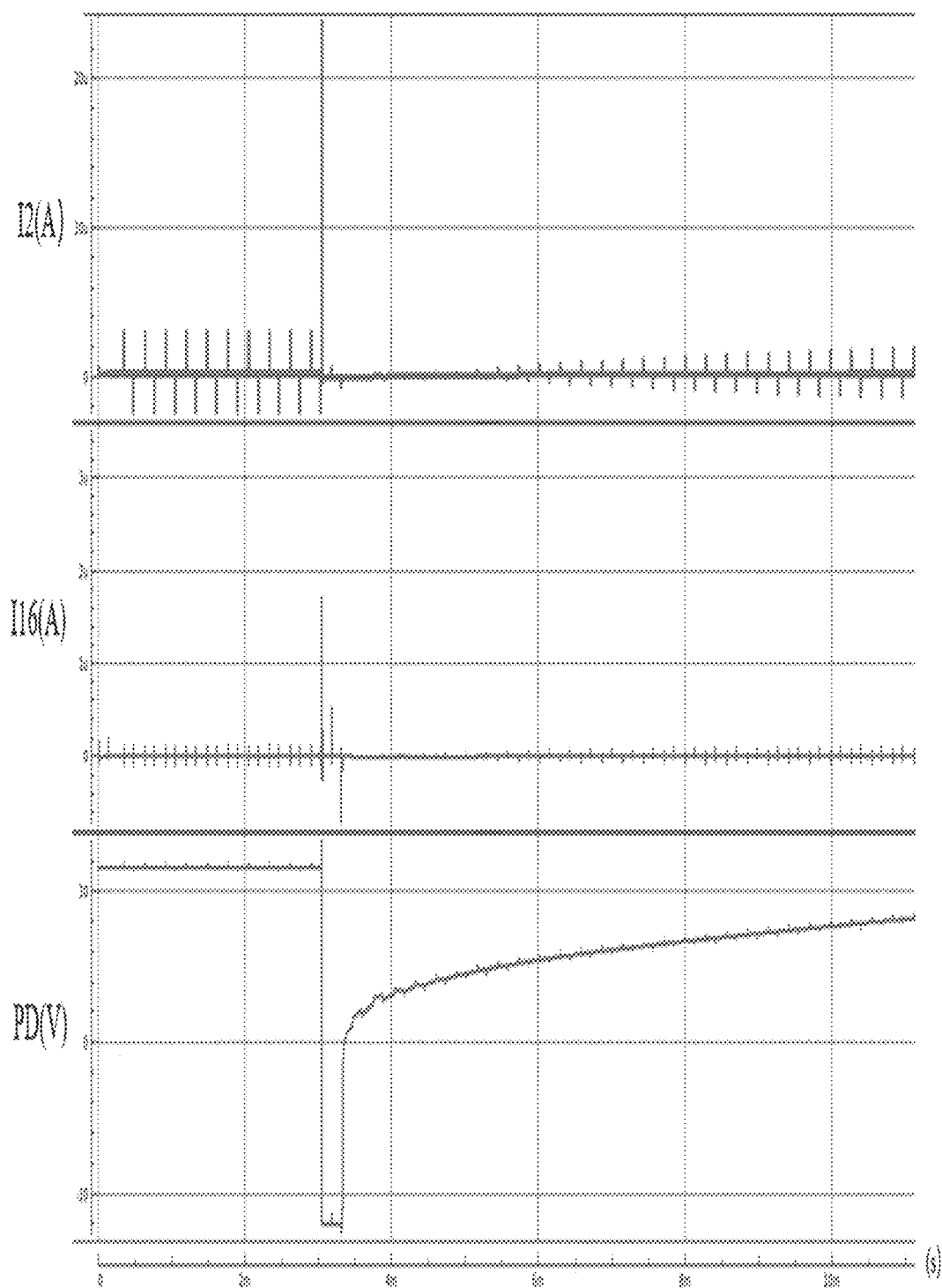
FIG. 16B is a waveform diagram of the current I2 of M2 and the current I16 of M16 of the driving circuit shown in FIG. 14 after the reliability test.

FIG. 16A is a waveform diagram of the current I1 of M2 and the current I16 of M16 of the related driving circuit after the reliability test, and FIG. 16B is waveform diagram of current I2 of M2 and current I16 of M16 of the driving circuit shown in FIG. 14 after the reliability test.

After the reliability test of the relevant driving circuit, I2 and I16 are very small, but in the driving circuit shown in FIG. 14, during the period that the potential of PD1 is high after the reset signal arrives, M2 has significantly high current, noise reduction ability of M2 is enhanced.

Figure 17A:
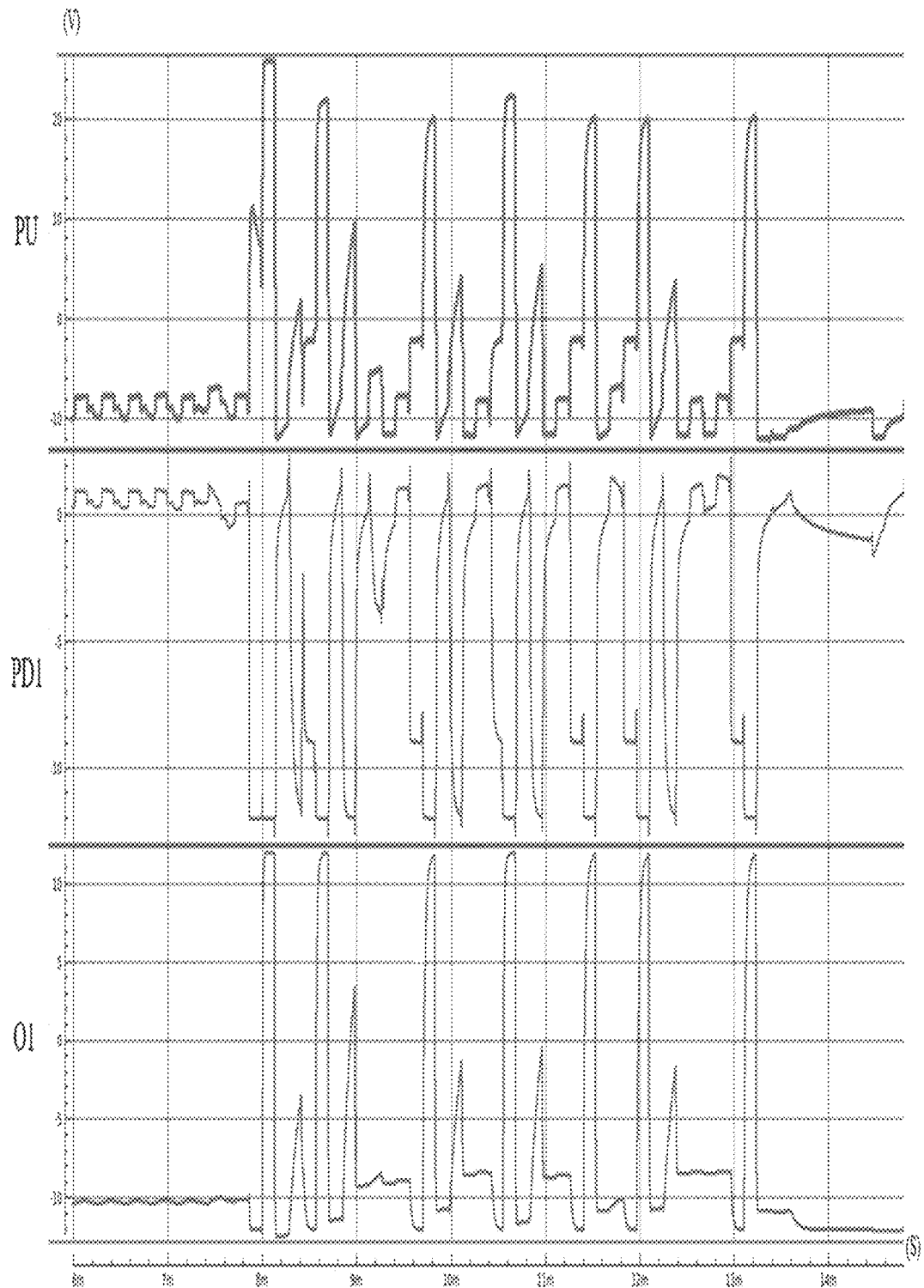
FIG. 17A is a waveform diagram of the potential of PU, the potential of PD1 and the driving signal output by O1 after the reliability test of the relevant driving circuit.
Figure 17B:
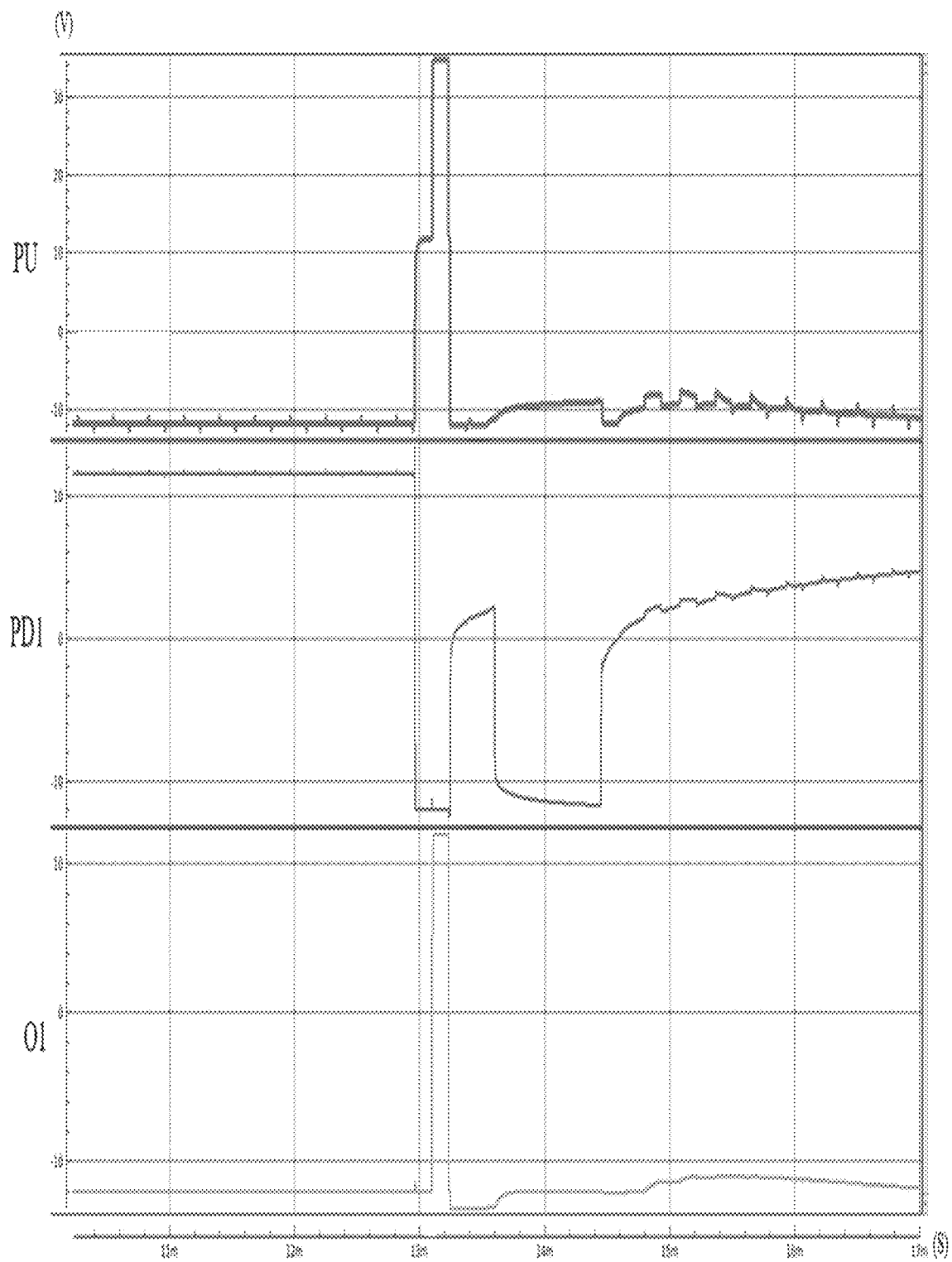
FIG. 17B is a waveform diagram of the potential of PU, the potential of PD1, and the driving signal output by O1 of the driving circuit shown in FIG. 14 after the reliability test.

FIG. 17A is a waveform diagram of the potential of PU, the potential of PD1 and the driving signal output by O1 of the related driving circuit after the reliability test. FIG. 17B is a waveform diagram of the potential of PU, the potential of PD1 and the driving signal output by O1 of the driving circuit shown in FIG. 14 after the reliability test.

After the reliability test, when the negative bias of the threshold voltage of M14 increases to the same extent, the driving signal output by the relevant driving circuit have multi-output, and in the driving circuit shown in FIG. 14, the driving signal is output correctly, and there is still little noise after the reset signal arrives.

Figure 18:
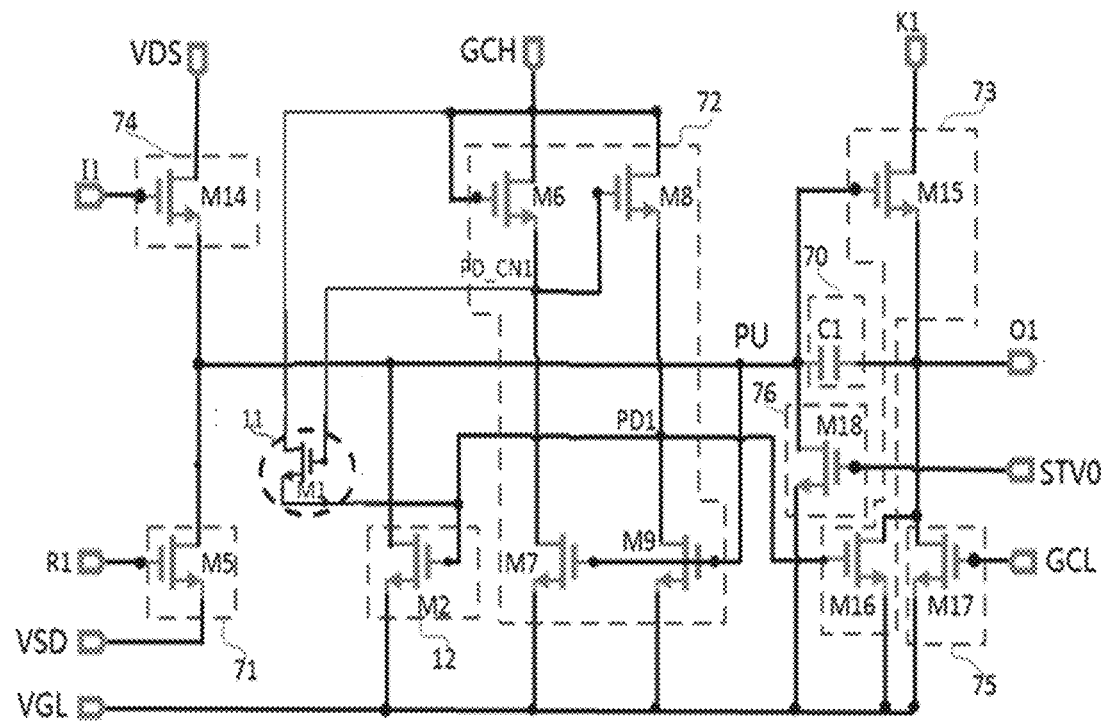
FIG. 18 is a circuit diagram of a driving circuit according to at least one embodiment of the present disclosure.

The difference between at least one embodiment of the driving circuit shown in FIG. 18 and at least one embodiment of the driving circuit shown in FIG. 11 is that the gate electrode of M1 is electrically connected to the first pull-down control node PD_CN1.

When at least one embodiment of the driving circuit shown in FIG. 18 is working, when the potential of PU is a low voltage and the potential of PD_CN1 is a high voltage, M1 is turned on, and the potential of PD1 is pulled up by the first control voltage provided by GCH.

At least one embodiment of the driving circuit shown in FIG. 18 is working, the potential of PD1 and the potential of PD_CN1 are high voltage at the same time, but the high voltage value of PD_CN1 is greater than the high voltage value of PD1, so compared with the driving circuit as shown in FIG. 14, the size of M1 can be set to be smaller, and the technical effect of a narrow frame of the display panel can be further realized due to the smaller size of the transistor.

Figure 19:
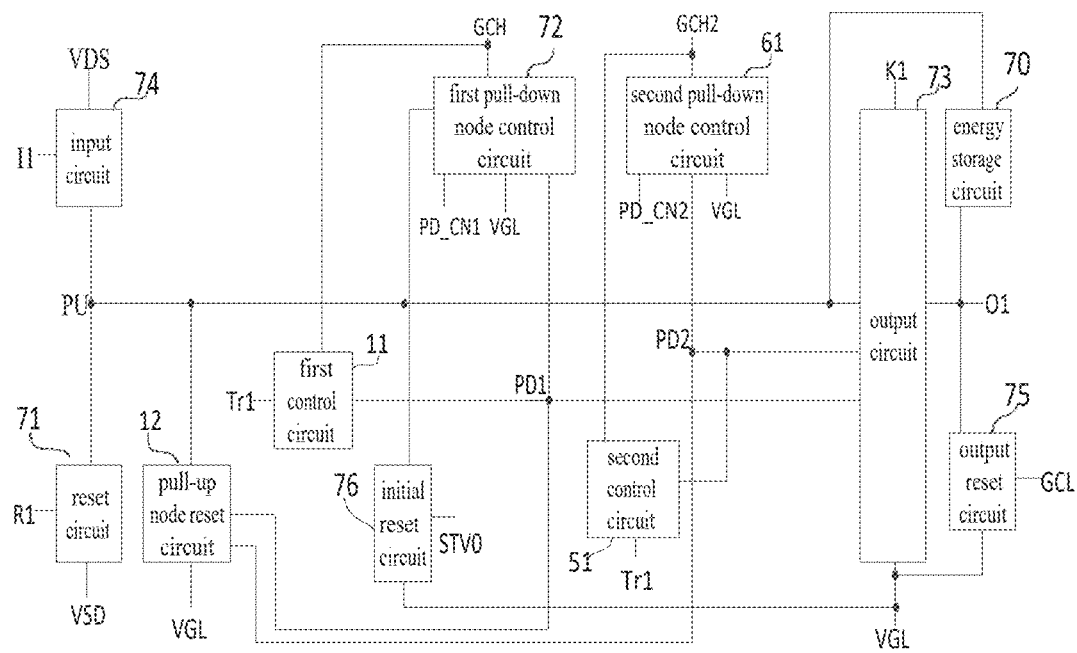
FIG. 19 is a structural diagram of a driving circuit according to at least one embodiment of the present disclosure.

In at least one embodiment shown in FIG. 18 of the present disclosure, setting only one pull-down node (the first pull-down node PD1) can not only reduce the number of transistors, but also facilitate the realization of a narrow frame of the display panel, and on the premise of only one pull-down node, the first control circuit controls the potential of the first pull-down node to be a valid voltage when the potential of the first control signal is a valid voltage, and the pull-up node reset circuit can control to reset the potential of the pull-up node under the control of the potential of the first pull-down node, improve the noise reduction capability of the transistor included in the pull-up node reset circuit, and prevent the driving circuit from outputting incorrectly, so that the driving circuit can correctly output driving signals. As shown in FIG. 19, on the basis of the driving circuit shown in FIG. 6, the driving circuit described in at least one embodiment of the present disclosure further includes a reset circuit 71, a first pull-down node control circuit 72, an output Circuit 73, an input circuit 74, an output reset circuit 75, an initial reset circuit 76 and an energy storage circuit 70; the second voltage terminal is the low voltage terminal VGL, and the first voltage terminal is the first control voltage terminal GCH;

The reset circuit 71 is electrically connected to the reset terminal R1, the pull-up node PU and the first input voltage terminal VSD respectively, and is used to control to write the first input voltage provided by the first input voltage terminal VSD into the pull-up node PU under the control of the reset signal provided by the reset terminal R1;

The first pull-down node control circuit 72 is electrically connected to the first pull-down node PD1, the first pull-down control node PD_CN1, the pull-up node PU, the first control voltage terminal GCH and the low voltage terminal VGL respectively, is configured to control to connect the first control voltage terminal GCH and the first pull-down control node PD_CN1 under the control of the first control voltage provided by the first control voltage terminal GCH, and control to connect the first pull-down control node PD_CN1 and the low voltage terminal VGL1 under the control of the potential of the pull-down node PU, and control to connect the first pull-down node PD1 and the first control voltage terminal GCH under the control of the potential of the first pull-down control node PD_CN1, and control to connect the first pull-down node PD1 and the low voltage terminal VGL under the control of the potential of the pull-up node PU;

The output circuit 73 is electrically connected to the pull-up node PU, the first pull-down node PD1, the second pull-down node PD2, the output clock signal terminal K1, the low voltage terminal VGL, and the driving signal output terminal O1, respectively, is configured to write the output clock signal provided by the output clock signal terminal K1 into the driving signal output terminal O1 under the control of the potential of the pull-up node PU, control to connect the driving signal output terminal O1 and the low voltage terminal VGL under the control of the potential of the first pull-down node PD1, and control to connect the driving signal output terminal O1 and the low voltage terminal VGL under the control of the potential of the second pull-down node PD2;

The input circuit 74 is electrically connected to the input terminal I1, the second input voltage terminal VDS and the pull-up node PU, and is used to control to write the second input voltage provided by the second input voltage terminal VDS into the pull-up node PU under the control of the input signal provided by the input terminal I1;

The output reset circuit 75 is electrically connected to the frame reset terminal GCL, the driving signal output terminal O1 and the low voltage terminal VGL respectively, and is used to control to connect the driving signal output terminal O1 and the low voltage terminal VGL under the control of the frame reset signal provided by the frame reset terminal GCL;

The initial reset circuit 76 is electrically connected to the initial reset terminal STV0, the pull-up node PU and the low voltage terminal VGL respectively, and is used to control to connect the pull-up node PU and the low voltage terminal VGL under the control of the initial reset signal provided by the initial reset terminal STV0;

The first end of the energy storage circuit 70 is electrically connected to the pull-up node PU, the second end of the energy storage circuit 70 is electrically connected to the driving signal output terminal O1, and the energy storage circuit 70 is used for storing electrical energy.

Figure 20:
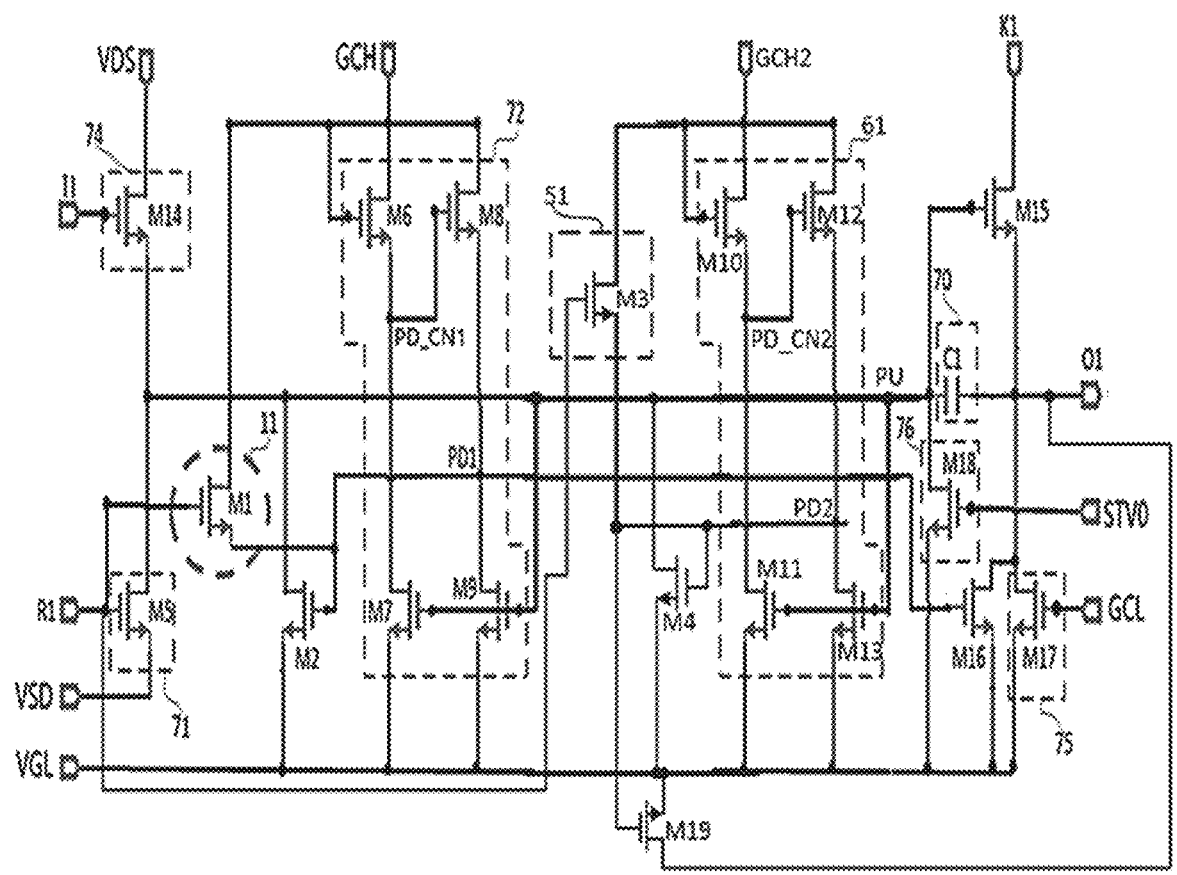
FIG. 20 is a circuit diagram of a driving circuit according to at least one embodiment of the present disclosure.

As shown in FIG. 20, on the basis of the driving circuit shown in FIG. 8, the first control circuit 11 includes a first transistor M1; both the first control terminal and the second control terminal are both the reset terminal R1;

The gate electrode of the first transistor M1 is electrically connected to the reset terminal R1, the source electrode of the first transistor M1 is electrically connected to the first pull-down node PD1, and the drain electrode of the first transistor M1 is electrically connected to the first control voltage terminal GCH;

The pull-up node reset circuit 12 includes a second transistor M2;

The gate electrode of the second transistor M2 is electrically connected to the first pull-down node PD1, the source electrode of the second transistor M2 is electrically connected to the pull-up node PU, and the drain electrode of the second transistor M2 is electrically connected to the low voltage terminal VGL;

The second control circuit 51 includes a third transistor M3; the pull-up node reset circuit 12 further includes a fourth transistor M4;

The gate electrode of the third transistor M3 is electrically connected to the reset terminal R1, the source electrode of the third transistor M3 is electrically connected to the second pull-down node PD2, and the drain electrode of the third transistor M3 is electrically connected to the second control voltage terminal GCH2;

The gate electrode of the fourth transistor M4 is electrically connected to the second pull-down node PD2, the source electrode of the fourth transistor M4 is electrically connected to the pull-up node PU, and the drain electrode of the fourth transistor M4 is electrically connected to the low voltage terminal VGL;

The reset circuit 71 includes a fifth transistor M5;

The gate electrode of the fifth transistor M5 is electrically connected to the reset terminal R1, the source electrode of the fifth transistor M5 is electrically connected to the pull-up node PU, and the drain electrode of the fifth transistor M5 is electrically connected to the first input voltage terminal VSD;

The first pull-down node control circuit 72 includes a sixth transistor M6, a seventh transistor M7, an eighth transistor M8 and a ninth transistor M9;

Both the gate electrode of the sixth transistor M6 and the source electrode of the sixth transistor M6 are electrically connected to the first control voltage terminal GCH, and the drain electrode of the sixth transistor M6 is connected to the first pull-down control node PD_CN1;

The gate electrode of the seventh transistor M7 is electrically connected to the pull-up node PU, the source electrode of the seventh transistor M7 is electrically connected to the first pull-down control node PD_CN1, and the drain electrode of the seventh transistor M7 electrically connected to the low voltage terminal VGL;

The gate electrode of the eighth transistor M8 is electrically connected to the first pull-down control node PD_CN1, the source electrode of the eighth transistor M8 is electrically connected to the first control voltage terminal GCH, and the drain electrode of the eighth transistor M8 is electrically connected to the first pull-down node PD1;

The gate electrode of the ninth transistor M9 is electrically connected to the pull-up node PU, the source electrode of the ninth transistor M9 is electrically connected to the first pull-down node PD1, and the drain electrode of the ninth transistor M9 is electrically connected to the low voltage terminal VGL;

The second pull-down node control circuit 61 includes a tenth transistor M10, an eleventh transistor M11, a twelfth transistor M12 and a thirteenth transistor M13;

Both the gate electrode of the tenth transistor M10 and the source electrode of the tenth transistor M10 are electrically connected to the second control voltage terminal GCH2, and the drain electrode of the tenth transistor M10 is electrically connected to the second pull-down control node PD_CN2;

The gate electrode of the eleventh transistor M11 is electrically connected to the pull-up node PU, the source electrode of the eleventh transistor M11 is electrically connected to the second pull-down control node PD_CN2, and the drain electrode of the eleventh transistor M11 is electrically connected to the low voltage terminal VGL;

The gate electrode of the twelfth transistor M12 is electrically connected to the second pull-down control node PD_CN2, the source electrode of the twelfth transistor M12 is electrically connected to the second control voltage terminal GCH2, and the drain electrode of the twelfth transistor M12 is electrically connected to the second pull-down node PD2;

The gate electrode of the thirteenth transistor M13 is electrically connected to the pull-up node PU, the source electrode of the thirteenth transistor M13 is electrically connected to the second pull-down node PD2, and the second electrode of the tenth transistor electrically connected to the third voltage terminal;

The input circuit 74 includes a fourteenth transistor M14;

The gate electrode of the fourteenth transistor M14 is electrically connected to the input terminal I1, the source electrode of the fourteenth transistor M14 is electrically connected to the second input voltage terminal VDS, and the drain electrode of the fourteenth transistor M14 electrode is electrically connected to the pull-up node PU;

The output circuit 73 includes a fifteenth transistor M15 and a sixteenth transistor M16;

The gate electrode of the fifteenth transistor M15 is electrically connected to the pull-up node PU, the source electrode of the fifteenth transistor M15 is electrically connected to the output clock signal terminal K1, and the drain electrode of the fifteenth transistor M15 is electrically connected to the driving signal output terminal O1;

The gate electrode of the sixteenth transistor M16 is electrically connected to the first pull-down node PD1, the source electrode of the sixteenth transistor M16 is electrically connected to the driving signal output terminal O1, and the drain electrode of the sixteenth transistor M16 is electrically connected to the low voltage terminal VGL;

The output reset circuit 75 includes a seventeenth transistor M17;

The gate electrode of the seventeenth transistor M17 is electrically connected to the frame reset terminal GCL, the source electrode of the seventeenth transistor M17 is electrically connected to the driving signal output terminal O1, and the drain electrode of the seventeenth transistor M17 is electrically connected to the low voltage terminal VGL;

The initial reset circuit 76 includes an eighteenth transistor M18;

The gate electrode of the eighteenth transistor M18 is electrically connected to the initial reset terminal STV0, the source electrode of the eighteenth transistor M18 is electrically connected to the pull-up node PU, and the drain electrode of the eighteenth transistor M18 electrically connected to the low voltage terminal VGL;

The energy storage circuit 70 includes a storage capacitor C1;

A first end of the storage capacitor C1 is electrically connected to the pull-up node PU, and a second end of the storage capacitor C1 is electrically connected to the driving signal output end O1.

The output circuit 73 also includes a nineteenth transistor M19;

The gate electrode of the nineteenth transistor M19 is electrically connected to the second pull-down node PD2, the source electrode of the nineteenth transistor M19 is electrically connected to the driving signal output terminal O1, and the drain electrode of the nineteenth transistor M19 is electrically connected to the low voltage terminal VGL.

In at least one embodiment of the driving circuit shown in FIG. 20, all transistors may be n-type thin film transistors, but not limited thereto.

At least one embodiment of the driving circuit shown in FIG. 20 of the present disclosure is capable of performing bidirectional scanning;

When VDS provides a high voltage signal and VSD provides a low voltage signal, the driving circuit can perform forward scanning;

When VDS provides a low voltage signal and VSD provides a high voltage signal, the driving circuit can perform backward scanning.

At least one embodiment of the driving circuit shown in FIG. 14 of the present disclosure adopts two pull-down nodes: a first pull-down node PD1 and a second pull-down node PD2;

Every several display periods (for example, every 2-3 seconds), the potential of the first control voltage provided by GCH and the potential of the second control voltage provided by GCH2 are high voltages alternately;

When the potential of the first control voltage is a high voltage, the potential of the second control voltage may be a low voltage; when the potential of the second control voltage is a low voltage, the potential of the first control voltage may be a high voltage; but not limited thereto.

At least one embodiment of the driving circuit shown in FIG. 20 of the present disclosure is working, when the potential of the first control voltage is a high voltage, the output phase included in the display period, and the output cut-off maintenance phase set after the output phase, the potential of PD1 is a high voltage;

When the potential of the second control voltage is a high voltage, the potential of PD2 is a high voltage during the reset phase included in the display period, and in the output cut-off maintenance phase set after the reset phase;

The transistor controlled by PD1 and the transistor controlled by PD2 are turned on alternately, so as to improve the threshold voltage drift phenomenon of the transistor.

At least one embodiment of the driving circuit shown in FIG. 20 of the present disclosure is working, when the potential of the first control voltage is a high voltage, in the reset phase included in the display period, R1 provides a high voltage signal, and M1 is turned on to pull up the potential of PD1;

When the potential of the second control voltage is a high voltage, in the reset phase included in the display period, R1 provides a high voltage signal, and M3 is turned on, so as to pull up the potential of PD2.

Figure 21:
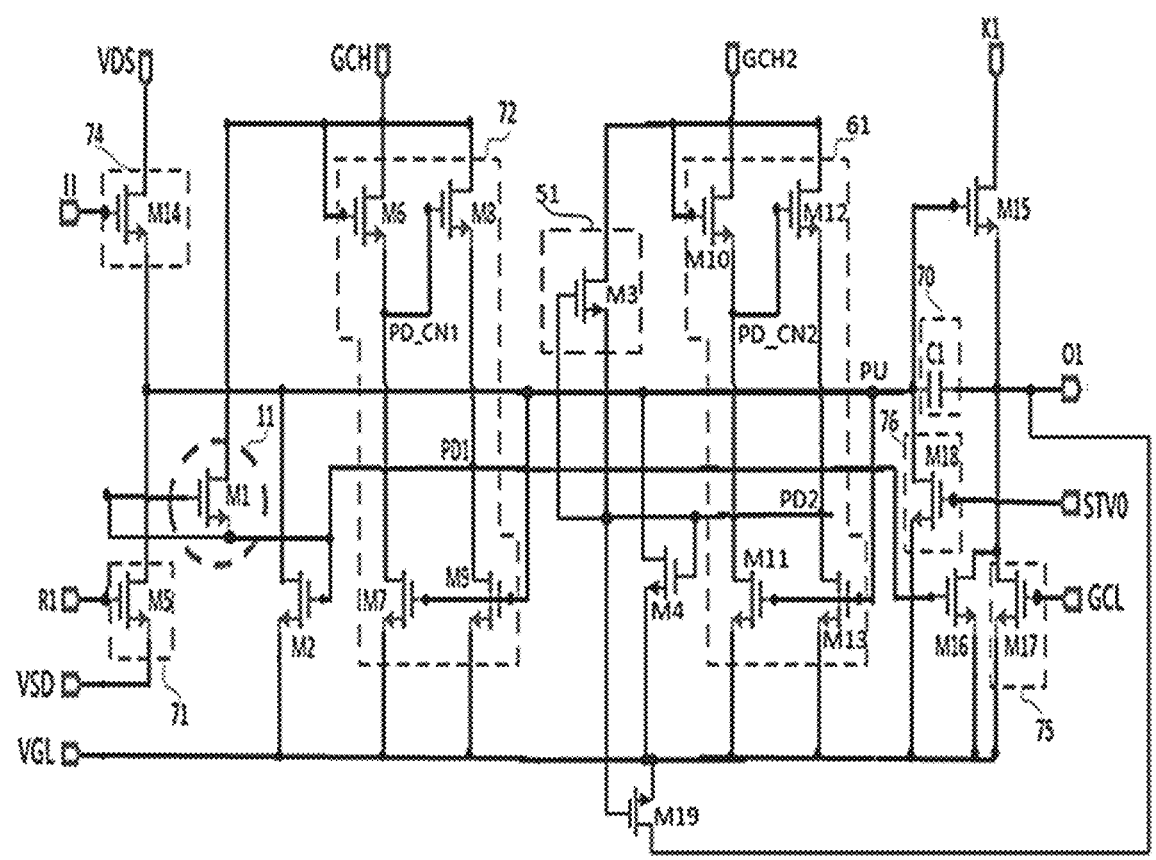
FIG. 21 is a circuit diagram of a driving circuit according to at least one embodiment of the present disclosure.

The difference between at least one embodiment of the driving circuit shown in FIG. 21 and at least one embodiment of the driving circuit shown in FIG. 20 is that the gate electrode of M1 is electrically connected to the first pull-down node PD1, and the gate electrode of the M3 is electrically connected to the second pull-down node PD2.

At least one embodiment of the driving circuit shown in FIG. 21 is working, when the first control voltage is a high voltage, when the potential of PU is a low voltage, and when the potential of PD1 is a high voltage, M1 is turned on, and further pulls up the potential of PD1 through the first control voltage provided by GCH;

When the second control voltage is a high voltage, when the potential of PU is a low voltage and the potential of PD2 is a high voltage, M3 is turned on, and the potential of PD1 is further pulled up by the second control voltage provided by GCH2.

Figure 22:
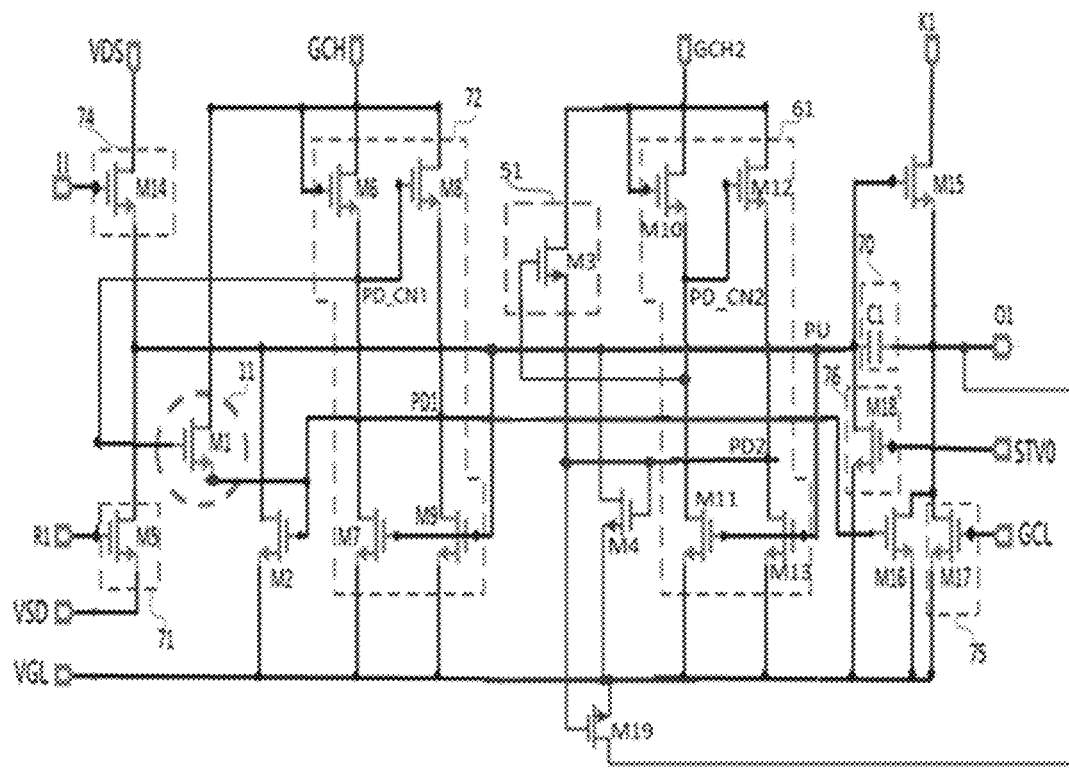
FIG. 22 is a circuit diagram of a driving circuit according to at least one embodiment of the present disclosure.

The difference between at least one embodiment of the driving circuit shown in FIG. 22 and at least one embodiment of the driving circuit shown in FIG. 20 is that the gate electrode of M1 is electrically connected to the first pull-down control node PD_CN1, and the gate electrode of M2 is electrically connected to the second pull-down control node PD_CN2.

At least one embodiment of the driving circuit shown in FIG. 22 is working, when the first control voltage is a high voltage, when the potential of PU is a low voltage, and when the potential of PD_CN1 is a high voltage, M1 is turned on, and the potential of PD1 is pulled up through the first control voltage provided by GCH;

When the second control voltage is a high voltage, when the potential of PU is a low voltage and the potential of PD_CN2 is a high voltage, M3 is turned on, and the potential of PD2 is pulled up by the second control voltage provided by GCH2.

At least one embodiment of the driving circuit shown in FIG. 22 is working, when the first control voltage is a high voltage, the potential of PD1 and the potential of PD_CN1 are both high voltages, but the high voltage value of PD_CN1 is greater than the high voltage value of PD1, so compared with at least one embodiment of the driving circuit shown in FIG. 20, the size of M1 can be set to be smaller;

When the second control voltage is a high voltage, the potential of PD2 and the potential of PD_CN2 are high voltage at the same time, but the high voltage value of PD_CN2 is greater than the high voltage value of PD2, so compared with at least one implementation of the driving circuit shown in FIG. 20, the size of M3 can be set smaller.

In the related art, when the high-temperature and high-humidity reliability test is performed on the driving circuit, the phenomenon of poor jitter stripes may occur. After the reliability test, the threshold voltage of M14 drifted negatively, the leakage current of M14 increased (direct factor), and the noise reduction capabilities of M2 and M16 decreased (indirect factor), which together caused the noise at the pull-up node and the driving signal terminal increases, and the noise at the driving output signal terminal will cause the pull-up node of the next stage of driving circuit to have greater noise, so the noise at the driving signal output terminal of the next stage of driving circuit is more serious, so the noise accumulates stage by stage, As a result, the output terminal of the driving signal set in the next stage of driving circuit have seriously Multi-output. The more severe the negative drift of the threshold voltage of M14 is, the faster the noise will accumulate, resulting in multi-outputs at the driving signal output terminal. For the 2.0-inch simulation results, when the threshold voltage of M14 drifts to −0.6V, multi-outputs will be generated, and when the threshold voltage of M14 is greater than −0.5V, multi-outputs will not be generated. After the reliability test, switching is performed to backward scanning. At 85 degrees Celsius, the threshold voltage of M14 drifts seriously. During backward scanning, the leakage current of M14 as a reset unit increases, resulting in no second-order rise in the potential of the pull-up node. The signal output terminal cannot output normally. At 70 degrees Celsius, the drift of M14 is small, and the leakage current of M14 is small, so the potential of the pull-up node can be raised in the second order, and the driving signal output terminal can output normally.

In the related art, when scanning in the forward direction, the potential of the pull-up node will not be reset through M5 (the drain electrode of M5 is not connected to the corresponding first input voltage) due to the scanning of the tail row, and the driving signal output terminal outputs the complete clock signal until reset after the frame. However, the middle row is affected by the reset and the leakage noise of M14, and the output period of the driving signal output terminal has no obvious rules.

When improving related art, it is initially suspected that the potential of PD1 drops after reliability, the characteristics of M2 drift, the noise reduction ability of the pull-up node PU is reduced, and the potential of PU have Multi waveform, resulting in jitter stripes. However, the PD1 potential of other models also dropped to 1V-2V after the reliability test. The actual measurement of the 2.0-inch derivative after the reliability test showed that the threshold voltage of M2 was 14V, which is also the normal level after the reliability test. Simulation is used to illustrate that the reduction of the PD1 potential and the threshold voltage drift of M2 and M2 will not cause severe Multi output at the output end of the driving signal.

In the related art, after the reliability test, when the characteristics of the transistor drift normally (the threshold voltage of M1 is 0.29V, the threshold voltage of M8 is 6.92V, and the threshold voltage of M2 is 14.79V), the potential of PU, the potential of PD1, and the waveform of the driving signal output by the driving signal output terminal; the high voltage value of PD1 is 1.33V, the low voltage value of PU is −11V, and when the potential of PU is a low voltage, it will fluctuate upwards by 1.7V many times, but the driving signal can be output normally.

After the reliability test, when the characteristic drift of M2 is aggravated (increase the threshold voltage of M2 to 25V), the potential of PU, the potential of PD1, and the waveform of the driving signal output by the driving signal output terminal; the low voltage value of PU is −11V, and the potential of the PU is a low voltage, it will fluctuate up to 2V many times, but the driving signal can be output normally.

After the reliability test, the drift of the threshold voltage of M2 caused the potential of the PU to fluctuate to a certain extent, but the potential of the PU was still at a low voltage, which would not cause the wrong output of the driving signal. There were other reasons for the rise of the potential of the PU.

In the related art, according to the analysis of high-temperature flickering failures, in bi-directional scanning, since the threshold voltage of M14 after reliability drifts negatively, resulting in increased leakage current and increased PU noise, which is prone to flickering when paired a single pull-down node is used. After increasing the negative drift of M14 after the reliability test (the threshold voltage of M14 is −3V, the threshold voltage of other transistors is the normal level after the reliability test), the simulation results prove that the potential of the PU and the driving signal terminal will produce serious Multi-output, resulting in abnormal display.

Based on the above tests, in the embodiment of the present disclosure, a first control circuit 11 is added. When the potential of the first control signal is a valid voltage, the first control circuit 11 controls to connect the first pull-down node PD1 and the first voltage terminal V1, so that the potential of the first pull-down node PD1 is a valid voltage, and the pull-up node reset circuit 12 controls to reset the potential of the pull-up node PU under the control of the potential of the first pull-down node PD1, to improve the noise reduction capability of the transistor included in the pull-up node reset circuit 12, so as to prevent the driving circuit from outputting incorrectly, so that the driving circuit can correctly output the driving signal.

The driving method described in the embodiment of the present disclosure is applied to the above-mentioned driving circuit, and the driving method includes:

controlling, by the first control circuit, to connect the first pull-down node and the first voltage terminal under the control of the first control signal, so that the potential of the first pull-down node is a valid voltage;

When the potential of the first pull-down node is a valid voltage, controlling, by the pull-up node reset circuit, to connect the pull-up node and the second voltage terminal, so as to reset the potential of the pull-up node.

In at least one embodiment of the present disclosure, the driving circuit further includes a second pull-down node and a second control circuit; the driving method further includes:

Controlling, by the second control circuit, to connect the second pull-down node and the fourth voltage terminal under the control of the second control signal, so that the potential of the second pull-down node is a valid voltage;

When the potential of the second pull-down node is a valid voltage, controlling, by the pull-up node reset circuit, to connect the pull-up node and the second voltage terminal, so as to reset the potential of the pull-up node.

The display device described in the embodiment of the present disclosure includes the above driving circuit.

The display device described in at least one embodiment of the present disclosure includes a driving module;

The driving module includes a plurality of stages of driving circuits cascaded to each other;

The first input voltage terminal of the last stage of driving circuit included in the driving module is not connected to the corresponding first input voltage, and the last stage of driving circuit is a dummy driving circuit;

The display device also includes a plurality of rows and a plurality of columns of pixel circuits arranged in the display area, and the last row of pixel circuits included in the display device may be a dummy pixel driving circuit;

The last stage of driving circuit is used to provide corresponding driving signals for the last row of pixel circuits, and the last row of pixel circuits does not emit light.

In the display device described in at least one embodiment of the present disclosure, the plurality of stages of driving circuits cascaded to each other form a driving module;

When performing forward scanning on the driving module, the reset circuit included in the last stage of the driving circuit is not connected to the corresponding first input voltage, so in the reset phase, the transistor included in the reset circuit will not be turned on, and the potential of the pull-up node in the last stage of driving circuit will not be reset, and the last stage of driving circuit may be a dummy driving circuit, and the dummy driving circuit may provide a driving signal for the dummy pixel circuit, and the dummy pixel circuit is not used for display.

Figure 23:
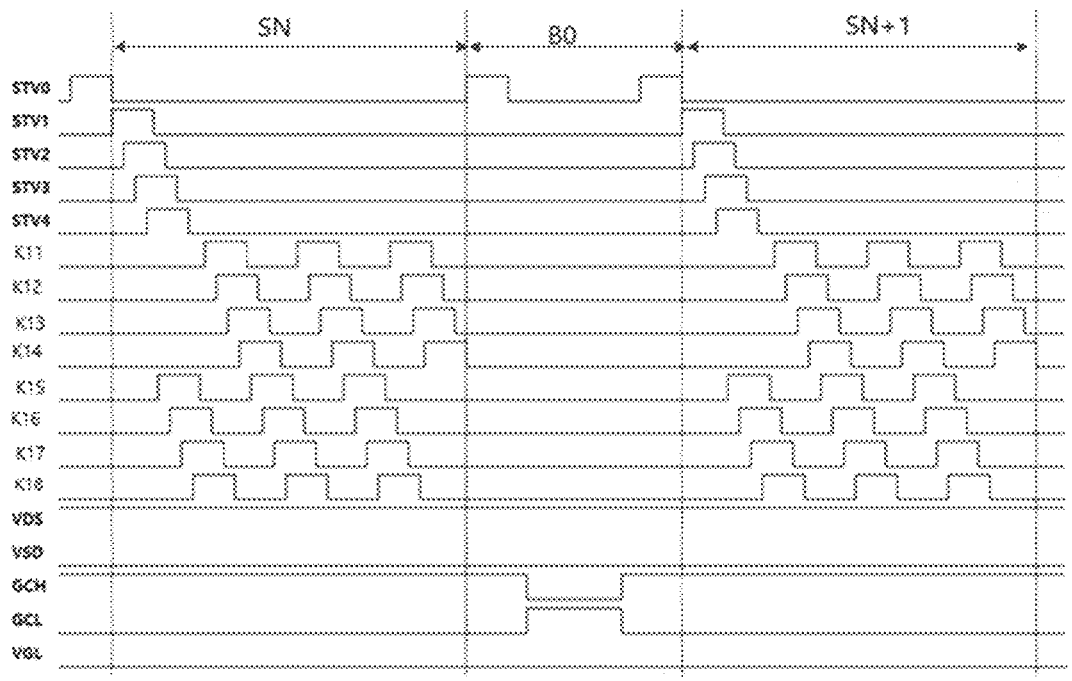
FIG. 23 shows waveform diagram of the potential of the initial reset signal provided by STV0, the first start signal STV1, the second start signal STV2, the third start signal STV3, the fourth start signal STV4, the first clock signal provided by the first clock signal terminal K11 signal, the second clock signal provided by the second clock signal terminal K12, the third clock signal provided by the third clock signal terminal K13, the fourth clock signal provided by the fourth clock signal terminal K14, the fifth clock signal provided by the fifth clock signal terminal K15, the sixth clock signal provided by the sixth clock signal terminal K16, the seventh clock signal provided by the seventh clock signal terminal K17, the eighth clock signal provided by the eighth clock signal terminal K18, the first input voltage provided by the first input voltage terminal VSD, the second input voltage provided by the second input voltage terminal VDS, a control voltage provided by the first control voltage terminal GCH, the frame reset signal provided by the frame reset terminal GCL and the low voltage signal provided by the low voltage terminal VGL.

In specific implementation, the display device may include a first driving module located on the left side of the display panel and a second driving module located on the right side of the display panel;

The first driving module includes a plurality of stages of driving circuits cascaded with each other;

The second driving module includes a plurality of stages of driving circuits cascaded with each other;

The second driving module is electrically connected to the second clock signal terminal K12, the fourth clock signal terminal K14, the sixth clock signal terminal K16 and the eighth clock signal terminal K18;

The first driving module is electrically connected to the first clock signal terminal K11, the third clock signal terminal K13, the fifth clock signal terminal K15 and the seventh clock signal terminal K17;

FIG. 23 shows the waveform diagram of the potential of the initial reset signal provided by STV0, the first start signal STV1, the second start signal STV2, the third start signal STV3, the fourth start signal STV4, and the first clock provided by the first clock signal terminal K11 signal, the second clock signal provided by the second clock signal terminal K12, the third clock signal provided by the third clock signal terminal K13, the fourth clock signal provided by the fourth clock signal terminal K14, the fifth clock signal provided by the fifth clock signal terminal K15, the sixth clock signal provided by the sixth clock signal terminal K16, the seventh clock signal provided by the seventh clock signal terminal K17, the eighth clock signal provided by the eighth clock signal terminal K18, the first input voltage provided by the first input voltage terminal VSD, the second input voltage provided by the second input voltage terminal VDS, a control voltage provided by the first control voltage terminal GCH, the frame reset signal provided by the frame reset terminal GCL and the low voltage signal provided by the low voltage terminal VGL.

In FIG. 23, SN is the Nth frame time, SN+1 is the (N+1)th frame time, and B0 is the blank time period between SN and SN+1.

The display device provided by the embodiments of the present disclosure may be any product or component with a display function, such as a mobile phone, a tablet computer, a television, a monitor, a notebook computer, a digital photo frame, a navigator, and the like.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A driving circuit, comprising an input circuit, an output circuit, a first pull-down node, a first control circuit and a pull-up node reset circuit; wherein
   the first control circuit is electrically connected to the first pull-down node, a first control terminal, and a first voltage terminal, respectively, is configured to control to connect the first pull-down node and the first voltage terminal under the control of a first control signal provided by the first control terminal, so that a potential of the first pull-down node is a valid voltage;
   the pull-up node reset circuit is electrically connected to the first pull-down node, a pull-up node, and a second voltage terminal, and is configured to control to connect the pull-up node and the second voltage terminal when the potential of the first pull-down node is the valid voltage, so as to reset a potential of the pull-up node;
   wherein the first control terminal is a reset terminal; wherein the reset terminal refers to: when a plurality of stages of driving circuits cascaded to each other are comprised, a current stage of driving circuit is a nth stage of driving circuit, for forward scanning, the reset terminal is connected to an output terminal of a (n+i)th stage of driving circuit, wherein n is a positive integer greater than or equal to 1, i is a positive integer greater than or equal to 1; or, for the driving circuit in which a cascaded output terminal and a gate scanning output terminal are separately output, the reset terminal is a signal terminal connected to the cascaded output terminal;
   the driving circuit further comprises a first pull-down node control circuit; wherein
   the first pull-down node control circuit is electrically connected to the first pull-down node, a first pull-down control node, the pull-up node, a first control voltage terminal and a third voltage terminal, is configured to control to connect the first control voltage terminal and the first pull-down control node under the control of the first control voltage provided by the first control voltage terminal, and control to connect the first pull-down control node and the third voltage terminal under the control of the potential of the pull-up node, and control to connect the first pull-down control node and the first control voltage terminal under the control of the potential of the first pull-down control node, and control to connect the first pull-down node and the third voltage terminal under the control of the potential of the pull-up node; and the third voltage terminal is a low voltage terminal;
   the first voltage terminal is the first control voltage terminal;
   the input circuit is respectively electrically connected to an input terminal, a second input voltage terminal and the pull-up node, and is configured to control to write a second input voltage provided by the second input voltage terminal into the pull-up node under the control of an input signal provided by the input terminal;
   wherein the output circuit is electrically connected to the pull-up node, the first pull-down node, an output clock signal terminal, a fourth voltage terminal and a driving signal output terminal, and is configured to control to write an output clock signal provided by the output clock signal terminal into the driving signal output terminal under the control of the potential of the pull-up node, and control to connect the driving signal output terminal and the fourth voltage terminal under the control of the potential of the first pull-down node;
   wherein the driving circuit further comprises an output reset circuit; the output reset circuit is electrically connected to a frame reset terminal, the driving signal output terminal and the fourth voltage terminal respectively, and is configured to control to connect the driving signal output terminal and the fourth voltage terminal under the control of a frame reset signal provided by the frame reset terminal; the output reset circuit comprises a seventeenth transistor; a gate electrode of the seventeenth transistor is electrically connected to the frame reset terminal, a first electrode of the seventeenth transistor is electrically connected to the driving signal output terminal, and a second electrode of the seventeenth transistor is electrically connected to the fourth voltage terminal;
   wherein the driving circuit further comprises an initial reset circuit; the initial reset circuit comprises an eighteenth transistor; a gate electrode of the eighteenth transistor is electrically connected to an initial reset terminal, a first electrode of the eighteenth transistor is electrically connected to the pull-up node, and a second electrode of the eighteenth transistor is electrically connected to the fourth voltage terminal; and the initial reset circuit is configured to reset the potential of the pull-up node at a front frame;
   wherein the driving circuit further comprises a reset circuit, the reset circuit comprises a fifth transistor; a gate electrode of the fifth transistor is electrically connected to the reset terminal, a first electrode of the fifth transistor is electrically connected to the pull-up node, and a second electrode of the fifth transistor is electrically connected to a first input voltage terminal; and
   wherein a signal phase of a first control voltage provided by first control voltage terminal is opposite to a signal phase of a frame reset signal provided by the frame reset terminal.

2. The driving circuit according to claim 1, wherein the first control circuit comprises a first transistor;
   a gate electrode of the first transistor is electrically connected to the first control terminal, a first electrode of the first transistor is electrically connected to the first pull-down node, and a second electrode of the first transistor is electrically connected to the first voltage terminal;

the pull-up node reset circuit comprises a second transistor;

a gate electrode of the second transistor is electrically connected to the first pull-down node, a first electrode of the second transistor is electrically connected to the pull-up node, and a second electrode of the second transistor is electrically connected to the second voltage terminal.

3. The driving circuit according to claim 1, wherein the reset circuit is respectively electrically connected to the reset terminal, the pull-up node and the first input voltage terminal, and is configured to control to write a first input voltage provided by the first input voltage terminal into the pull-up node under the control of a reset signal provided by the reset terminal.

4. The driving circuit according to claim 1, further comprising a second pull-down node and a second control circuit; wherein the second control circuit is electrically connected to the second pull-down node, the second control terminal and a fifth voltage terminal, and is configured to control to connect the second pull-down node and the fifth voltage terminal under the control of a second control signal provided by the second control terminal, so that a potential of the second pull-down node is a valid voltage;

the pull-up node reset circuit is also electrically connected to the second pull-down node, and is configured to control to connect the pull-up node and the second voltage terminal when the potential of the second pull-down node is the valid voltage, to reset the potential of the pull-up node.

5. The driving circuit according to claim 4, wherein the second control terminal is a reset terminal, a second pull-down node or a second pull-down control node.

6. The driving circuit according to claim 5, further comprising a second pull-down node control circuit; wherein the second pull-down node control circuit is electrically connected to the second pull-down node, the second pull-down control node, the pull-up node, the second control voltage terminal, and the third voltage terminal, respectively, is configured to control to connect the second control voltage terminal and the second pull-down control node under the control of the second control voltage provided by the second control voltage terminal, control to connect the second pull-down control node and the third voltage terminal under the control of the potential of the pull-up node, control to connect the second pull-down node and the second control voltage terminal under the control of the potential of the second pull-down control node, and control to connect the second pull-down node and the third voltage terminal under the control of the potential of the pull-up node;

the fifth voltage terminal is the second control voltage terminal.

7. The driving circuit according to claim 6, wherein the second pull-down node control circuit comprises a tenth transistor, an eleventh transistor, a twelfth transistor, and a thirteenth transistor;

both a gate electrode of the tenth transistor and a first electrode of the tenth transistor are electrically connected to the second control voltage terminal, and a second electrode of the tenth transistor is electrically connected to the second pull-down control node;

a gate electrode of the eleventh transistor is electrically connected to the pull-up node, a first electrode of the eleventh transistor is electrically connected to the second pull-down control node, and a second electrode of the eleventh transistor is electrically connected to the third voltage terminal;

a gate electrode of the twelfth transistor is electrically connected to the second pull-down control node, a first electrode of the twelfth transistor is electrically connected to the second control voltage terminal, and a second electrode of the twelfth transistor is electrically connected to the second pull-down node;

a gate electrode of the thirteenth transistor is electrically connected to the pull-up node, a first electrode of the thirteenth transistor is electrically connected to the second pull-down node, and a second electrode of the tenth transistor is electrically connected to the third voltage terminal.

8. The driving circuit according to claim 4, wherein the second control circuit comprises a third transistor; the pull-up node reset circuit further comprises a fourth transistor;

a gate electrode of the third transistor is electrically connected to the second control terminal, a first electrode of the third transistor is electrically connected to the second pull-down node, and a second electrode of the third transistor is electrically connected to the fifth voltage terminal;

a gate electrode of the fourth transistor is electrically connected to the second pull-down node, a first electrode of the fourth transistor is electrically connected to the pull-up node, and a second electrode of the fourth transistor is electrically connected to the second voltage terminal.

9. The driving circuit according to claim 1, further comprising an energy storage circuit; wherein the initial reset circuit is electrically connected to the initial reset terminal, the pull-up node and the fourth voltage terminal, and is configured to control to connect the pull-up node and the fourth voltage terminal under the control of the initial reset signal provided by the initial reset terminal;

a first end of the energy storage circuit is electrically connected to the pull-up node, a second end of the energy storage circuit is electrically connected to the driving signal output terminal, and the energy storage circuit is used for storing electric energy.

10. The driving circuit according to claim 9, wherein the input circuit comprises a fourteenth transistor;

a gate electrode of the fourteenth transistor is electrically connected to the input terminal, a first electrode of the fourteenth transistor is electrically connected to the second input voltage terminal, and a second electrode of the fourteenth transistor is electrically connected to the pull-up node;

the output circuit comprises a fifteenth transistor and a sixteenth transistor;

a gate electrode of the fifteenth transistor is electrically connected to the pull-up node, a first electrode of the fifteenth transistor is electrically connected to the output clock signal terminal, and a second electrode of the fifteenth transistor is electrically connected to the driving signal output terminal;

a gate electrode of the sixteenth transistor is electrically connected to the first pull-down node, a first electrode of the sixteenth transistor is electrically connected to the driving signal output terminal, and a second electrode of the sixteenth transistor electrically connected to the fourth voltage terminal;

the energy storage circuit comprises a storage capacitor;

a first end of the storage capacitor is electrically connected to the pull-up node, and a second end of the storage capacitor is electrically connected to the driving signal output terminal.

11. The driving circuit according to claim 10, further comprising a second pull-down node; wherein the output circuit is also electrically connected to the second pull-down node, and is configured to control to connect the driving signal output terminal and the fourth voltage terminal under the control of the potential of the second pull-down node, wherein the output circuit further comprises a nineteenth transistor;

a gate electrode of the nineteenth transistor is electrically connected to the second pull-down node, a first electrode of the nineteenth transistor is electrically connected to the driving signal output terminal, and a second electrode of the nineteenth transistor is electrically connected to the fourth voltage terminal.

12. The driving circuit according to claim 1, wherein the first pull-down node control circuit comprises a sixth transistor, a seventh transistor, an eighth transistor and a ninth transistor;

both a gate electrode of the sixth transistor and a first electrode of the sixth transistor are electrically connected to the first control voltage terminal, and a second electrode of the sixth transistor is electrically connected to the first pull-down control node;

a gate electrode of the seventh transistor is electrically connected to the pull-up node, a first electrode of the seventh transistor is electrically connected to the first pull-down control node, and a second electrode of the seventh transistor is electrically connected to the third voltage terminal;

a gate electrode of the eighth transistor is electrically connected to the first pull-down control node, a first electrode of the eighth transistor is electrically connected to the first control voltage terminal, and a second electrode of the eighth transistor is electrically connected to the first pull-down node;

a gate electrode of the ninth transistor is electrically connected to the pull-up node, a first electrode of the ninth transistor is electrically connected to the first pull-down node, and a second electrode of the ninth transistor is electrically connected to the third voltage terminal.

13. A driving method applied to the driving circuit according to claim 1, the driving method comprising:

controlling, by the first control circuit, to connect the first pull-down node and the first voltage terminal under the control of the first control signal, so that the potential of the first pull-down node is the valid voltage;

when the potential of the first pull-down node is a valid voltage, controlling, by the pull-up node reset circuit, to connect the pull-up node and the second voltage terminal, so as to reset the potential of the pull-up node.

14. The driving method according to claim 13, wherein the driving circuit further comprises a second pull-down node and a second control circuit; the driving method further comprises:

controlling, by the second control circuit, to connect the second pull-down node and the fifth voltage terminal under the control of the second control signal, so that the potential of the second pull-down node is a valid voltage;

when the potential of the second pull-down node is the valid voltage, controlling, by the pull-up node reset circuit, to connect the pull-up node and the second voltage terminal, so as to reset the potential of the pull-up node.

15. A display device comprising the driving circuit according to claim 1.

16. The display device according to claim 15, comprising a driving module; wherein the driving module comprises a plurality of stages of driving circuits cascaded to each other;

a first input voltage terminal of a last stage of driving circuit comprised in the driving module is not connected to a corresponding first input voltage, and the last stage of driving circuit is a dummy driving circuit;

the display device further comprises a plurality of rows and a plurality of columns of pixel circuits arranged in a display area, and a last row of pixel circuits comprised in the display device may be a dummy pixel driving circuit;

the last stage of driving circuit is used to provide a corresponding driving signal for the last row of pixel circuits, and the last row of pixel circuits do not emit light.

* * * * *